(12) United States Patent
Lachartre

(10) Patent No.: US 11,095,292 B2
(45) Date of Patent: Aug. 17, 2021

(54) FREQUENCY SYNTHESIS DEVICE WITH FEEDBACK LOOP

(71) Applicant: Commissariat à l'énergie atomique et aux énergies alternatives, Paris (FR)

(72) Inventor: David Lachartre, Montbonnot (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/922,750

(22) Filed: Jul. 7, 2020

(65) Prior Publication Data
US 2021/0013890 A1 Jan. 14, 2021

(30) Foreign Application Priority Data

Jul. 8, 2019 (FR) ...................................... 1907587

(51) Int. Cl.
*H03L 7/087* (2006.01)
*H03L 7/18* (2006.01)

(52) U.S. Cl.
CPC ............ *H03L 7/087* (2013.01); *H03L 7/1806* (2013.01)

(58) Field of Classification Search
CPC ... H03L 7/087; H03L 2207/50; H03L 7/1806; H03L 7/085
See application file for complete search history.

(56) References Cited

U.S. PATENT DOCUMENTS

| | | |
|---|---|---|
| 5,351,014 A | 9/1994 | Ichiyoshi |
| 6,046,643 A | 4/2000 | Kranz |
| 8,373,469 B2 * | 2/2013 | Kim .......................... H03L 7/23 327/157 |
| 9,509,320 B2 | 11/2016 | Lachartre |
| 2009/0085674 A1 | 4/2009 | Rofougaran |
| 2011/0133795 A1 | 6/2011 | Kim et al. |
| 2020/0076440 A1 * | 3/2020 | Ng .......................... H03L 7/081 |

FOREIGN PATENT DOCUMENTS

| | | |
|---|---|---|
| FR | 2 763 196 A1 | 11/1998 |
| WO | 2004/001974 A1 | 12/2003 |
| WO | 2009/053531 A1 | 4/2009 |

OTHER PUBLICATIONS

Staszewski, et al., "Phase-domain all-digital phase-locked loop", IEEE Transactions on Circuits and Systems-II: express briefs, vol. 52, No. 3, pp. 159-163, Mar. 2005.

* cited by examiner

*Primary Examiner* — Ryan Johnson
(74) *Attorney, Agent, or Firm* — BakerHostetler

(57) ABSTRACT

A frequency synthesis device includes a servo circuit for controlling an output frequency to an input reference frequency. The circuit includes a first phase accumulator clocked by the reference frequency, a phase comparison block, a loop filter and an oscillator. It further includes a feedback loop connecting the output to the comparison block, having a second phase accumulator clocked by the output frequency. The comparison block includes T phase comparators with logic gates receiving respectively T first logic signals from the servo circuit on T first inputs and T second logic signals from the feedback loop on T second inputs, the T first and second signals having logic levels that continuously depend on values provided by the first and second accumulators according to at least one multi-phase correspondence matrix.

10 Claims, 11 Drawing Sheets

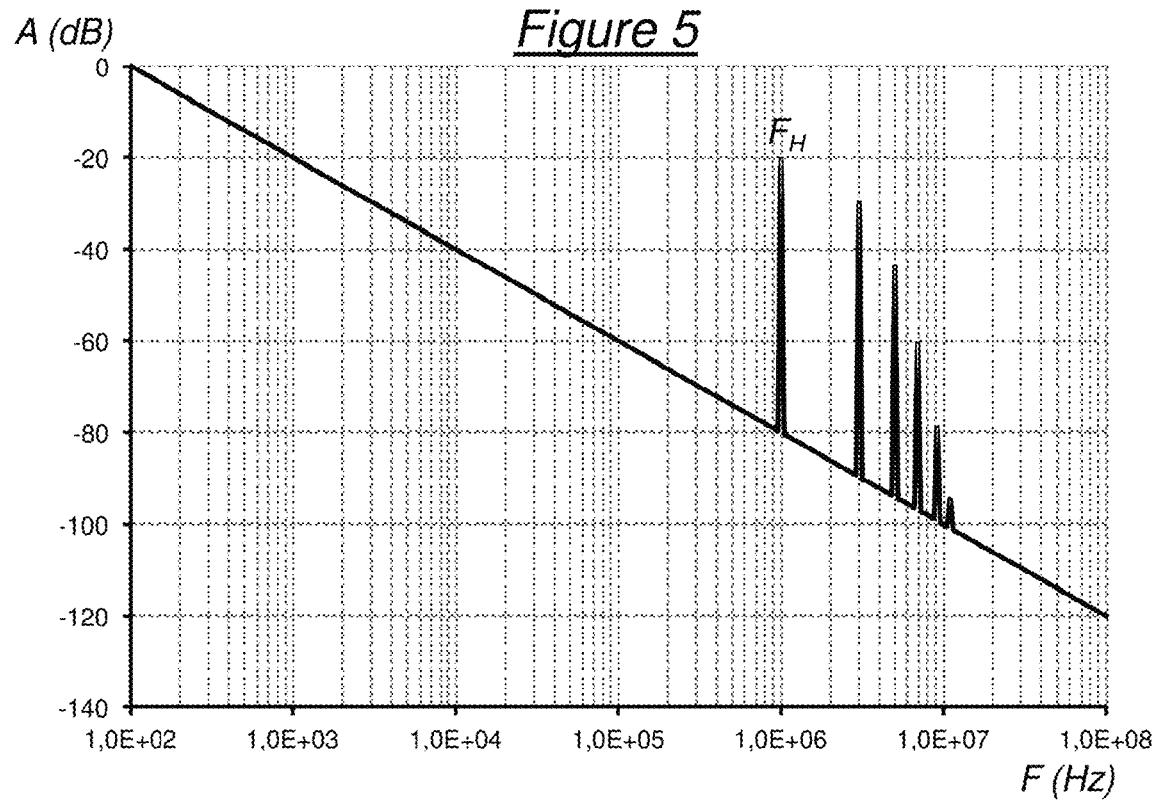
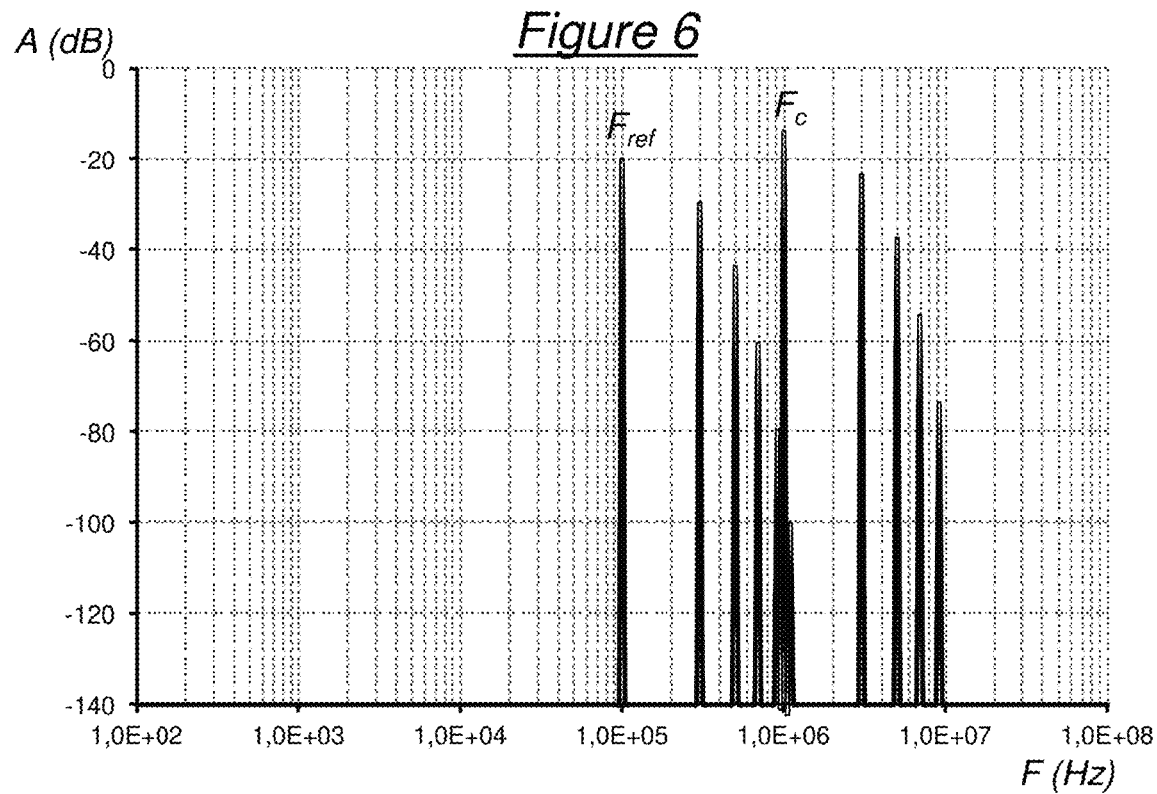

FREQUENCY SYNTHESIS DEVICE WITH FEEDBACK LOOP

CROSS-REFERENCE TO RELATED APPLICATION

This application claims priority to foreign French patent application No. FR 1907587, filed on Jul. 8, 2019, the disclosure of which is incorporated by reference in its entirety.

FIELD OF THE INVENTION

The present invention relates to a feedback-loop frequency synthesis device.

BACKGROUND

Such devices are known, for example phase controlled loops or PLL, generally called phase locked loops.

A device of this type comprises:
- an input intended to receive an electrical signal oscillating at a reference frequency;
- an output intended to supply an electrical signal oscillating at an output frequency;
- a servo circuit for the control of the output frequency by the reference frequency, connecting the input to the output of the device and comprising a phase comparison block, a loop filter and a frequency-controlled oscillator supplying the oscillating electrical signal at the output frequency, and
- a feedback loop connecting the output to the phase comparison block.

The frequency-controlled oscillator, for example of the VCO type (for "Voltage Controlled Oscillator"), DCO type (for "Digitally Controlled Oscillator") or other, is controlled by a digital value, an analog voltage or current, or even a combination of an analog value and a digital value. Although this is generally not the case, the transfer function of such an oscillator is often considered to be linear and simply represented by a conversion factor K.

The phase comparison block generally operates on edges of signals to be compared, that is to say when these signals reach the same value with the same slope. The phase comparison then itself provides one or more signals which represent the phase difference between the edges of the compared signals. Most of the time, the signals resulting from the comparison are transformed into a single current or voltage pulse signal by a charge pump. This current (or voltage) is of constant amplitude I (or U), it takes the sign of the phase difference and its pulse has a width proportional to the phase difference. The phase comparison block can be made more or less analog or digital.

The pulse supplied by the charge pump is then filtered by the loop filter which is based on the pulse response of an integrating filter. The loop filter can also be produced in a more or less analog or digital manner.

The result from the loop filter is then applied as a command of the frequency-controlled oscillator. As the loop filter is an integrator and the integral of the phase of a periodic signal gives its frequency, the control of the oscillator is indeed proportional to a frequency which will tend towards the desired frequency as output as and when the phase difference with the reference signal will tend towards 0 or towards another constant value.

PLLs are thus generally used in electronic circuits as sources of high frequencies. Indeed, these devices make it possible from a source at low frequency and high spectral purity (for example quartz emitting periodic signals at a few MHz) to obtain periodic signals at high frequency (for example a few GHz) and with better spectral purity than devices that directly generate high frequency signals.

Specifically, for a $F_{ref}$ low reference frequency and high spectral purity source, a signal of good spectral purity with high frequency $F_c = \alpha \cdot F_{ref}$ is obtained, wherein $\alpha$ is a multiplying factor chosen to be greater to 1. This multiplying factor $\alpha$ is generally variable and of non-integer real value in order to vary the different channels of the standards used depending on the application.

An important parameter of frequency synthesis devices is the time $\Delta t$ for establishing their operating mode, that is to say the time they take to be functional, either at start-up or during a change of channel (i.e. change of the factor $\alpha$). This time $\Delta t$ lasts during a transient mode, generally qualified as a latching phase, preceding the operating mode. Thus for example, during the passage $\Delta F_c$ from a frequency $F_c$ to a frequency $F'_c$, the transient mode of synthesized frequency follows an exponential envelope tending asymptotically towards $F'_c$ at a natural resonant frequency $\omega$ during the duration $\Delta t$. The duration $\Delta t$ of the latching phase depends on the parameters constituting a frequency synthesis device and limits its reactivity.

Another important parameter of frequency synthesis devices is the resolution of the possible variations of the multiplying factor $\alpha$ and therefore the fineness of possible adjustment of the output frequency $F_c$ as a function of the targeted applications or standards.

Other parameters to consider, to optimize the frequency synthesis devices and the quality of the periodic signals of frequency $F_c$ obtained at output, include phase noise, jitter, spurious signals and power consumption.

According to a well-known concept of PLLs, called integer division, the multiplying factor $\alpha$ is chosen as the ratio of two integer values N and D where the value N is generally greater than D. To achieve this control $F_c = \alpha \cdot F_{ref} = N/D \cdot F_{ref}$, a D factor frequency divider is arranged in the servo circuit between the input and a first comparison input of a comparator of the phase comparison block, while a N factor frequency divider is arranged in the feedback loop between the output, which corresponds to the output of the frequency-controlled oscillator, and a second comparison input of the phase comparator. In this way, the frequency of the two signals compared by the phase comparator is intended to converge towards $F_{ref}/D = F_c/N$ when the loop is locked. Thus, at the output of the phase comparator, although filtered by the loop filter, this frequency $F_{ref}/D$ is found at the control of the frequency-controlled oscillator and therefore as an interference in the spectrum of the output signal. Furthermore, it is clear that the value of D is directly correlated to the resolution of the possible variations of the multiplying factor $\alpha$ since these variations are made, for different possible values of N, by frequency steps of $F_{ref}/D$.

It follows that to increase the resolution of the possible variations of the multiplying factor $\alpha$, it would be advisable to increase the value of D. But in this case, the frequency $F_{ref}/D$ would be reduced and it would then be necessary to also reduce the bandwidth of the loop filter to limit the resulting interferences in the spectrum of the output signal. However, limiting the bandwidth of the loop filter leads to lengthening the time $\Delta t$ of establishing the operating mode. Consequently, jointly optimizing the two important parameters of a PLL, which are the time for establishing the operating mode and the resolution of the possible variations of the multiplying factor α, is impossible to achieve with a PLL with integer division.

Furthermore, the contributions to the phase noise induced at the output also directly depend on the cut-off frequency of the PLL. In the bandwidth, noise is dominated by the contribution of the reference signal. Although multiplied by a, it generally remains less than that provided by the PLL itself. It may thus be preferable to increase the cut-off frequency of the PLL in order to lower the phase noise in the lower part of the spectrum obtained at the output. But in this case, it's to the detriment of the value of D. Consequently, jointly optimizing the phase noise and the resolution of the possible variations of the multiplying factor α is impossible to achieve with a PLL with integer division A partial solution to these drawbacks consists in designing a PLL with fractional steps as taught in patent application FR 2 763 196 A1. In this case, the frequency divider arranged in the feedback loop switches between the factor N and the factor N+1 according to a predetermined desired proportion, so as to produce on average, by means of the loop filter, a multiplying factor $\alpha=(N+\beta)/D$, avec $0 \le \beta \le 1$. Thus, without increasing the value of D, it becomes possible to increase the resolution of the possible variations of the multiplying factor α.

However, to achieve this switching of the divider of the feedback loop between the two values N and N+1 according to a desired proportion, a Delta-Sigma modulator is generally used. This modulator has the particularity of generating a signal resulting from a quantization of the coefficient β on 1 bit and the quantization necessarily produces a quantization error which, in the case of the Delta-Sigma modulator, is not uniformly distributed in the output spectrum but is amplified in the high frequencies. The loop filter therefore partially attenuates the noise resulting from this error. Nevertheless, a PLL with fractional steps produces a signal which remains more or less marred by additional noise due to the generation of the coefficient β. Besides, the more precision β will need (i.e. for better resolution at constant N and D), the greater this additional noise.

In addition, a PLL with fractional steps does not either optimize the phase noise independently of the multiplying factor α, the operating frequency of the phase comparator remaining dependent on this factor.

Another solution consists in not using frequency dividers but phase accumulators, as taught for example in patent applications US 2011/0133795 A1 and WO 2009/053531 A1, or in the article by Staszewski and al, entitled "Phase-domain all-digital phase-locked loop", published in March 2005 in IEEE Transactions on Circuits and Systems-II: express briefs, vol. 52, No. 3, pages 159-163, so as to digitally calculate phase accumulations from each of the reference and output signals rather than performing a phase comparison on signals from dividers. This other solution is in particular well suited to the design of so-called "fully digital" PLLs.

In accordance with this other solution, the invention relates more specifically to a feedback-loop frequency synthesis device comprising:
an input intended to receive an electrical signal oscillating at a reference frequency;
an output intended to supply an electrical signal oscillating at an output frequency;
a servo circuit for the control of the output frequency by the reference frequency, connecting the input to the output of the device and comprising a first phase accumulator clocked at a frequency linked to the reference frequency, a phase comparison block, a loop filter and a frequency controlled oscillator providing the electrical signal oscillating at the output frequency; and
a feedback loop connecting the output to the phase comparison block, comprising a second phase accumulator clocked at a frequency linked to the output frequency, the first and second phase accumulators being adapted to provide the same number T of possible phase accumulation discrete values.

Thus, for a PLL with integer division of multiplying factor α=N/D, the first phase accumulator can for example be associated with a phase increment value equal to N and the second with a phase increment value equal to D.

It follows from this other solution that the operating frequency of the phase comparator can be made independent of the factor α and therefore of the choice of D. D can then be increased in much larger proportions than those of devices with frequency dividers, while maintaining a high operating frequency of the phase comparator, resulting in a better resolution without compromise on the time Δt of establishment of the operating mode or on the phase noise.

However, this other solution provides digital values at the outputs of the phase accumulators and these are clocked at different frequencies. More precisely, in the documents US 2011/0133795 A1, WO 2009/053531 A1 and in the article by Staszewski et al cited above, the frequency on which the digital values originating from the first phase accumulator are clocked is $F_{ref}$, while the frequency on which the digital values from the second phase accumulator are clocked is $F_c$. The data supplied to the phase comparator, which is nothing else than a digital subtractor, is therefore not synchronized with each other, which raises an issue.

This issue is for example solved in a partial and unsatisfactory manner in WO 2009/053531 A1, or in the aforementioned article by Staszewski et al, by singularly complicating the feedback loop in an attempt to resynchronize between them the digital data originating from the two phase accumulators. This resynchronization also generates additional noise.

This issue is however solved in a more satisfactory way in patent document U.S. Pat. No. 9,509,320 B2 which proposes to have digital/analog converters at the outputs of the phase accumulators and to supply the resulting signals to an analog phase comparator implemented in practice by a subtractor of these signals.

However, phase accumulators cannot produce values that increment indefinitely. It is generally necessary to provide an accumulated phase threshold value beyond which it is intended to subtract a modulo value. But it is then also necessary to provide a mechanism for synchronizing the subtractions of the modulo value between the phase accumulators, which has a certain complexity and is capable of generating a transient parasitic noise perceptible at the output of the oscillator.

It may thus be desired to provide a feedback-loop frequency synthesis device that makes it possible to overcome at least some of the aforementioned problems and constraints.

SUMMARY OF THE INVENTION

It is therefore proposed a feedback-loop frequency synthesis device comprising:
an input intended to receive an electrical signal oscillating at a reference frequency;

an output intended to supply an electrical signal oscillating at an output frequency;

a servo circuit for the control of the output frequency by the reference frequency, connecting the input to the output of the device and comprising a first phase accumulator clocked at a frequency linked to the reference frequency, a phase comparing block, a loop filter and a frequency controlled oscillator providing the electrical signal oscillating at the output frequency; and a feedback loop connecting the output to the phase comparison block, comprising a second phase accumulator clocked at a frequency linked to the output frequency, the first and second phase accumulators being adapted to provide the same number T of possible phase accumulation discrete values;

wherein:

the servo circuit is configured to provide, to the phase comparison block, T first distinct logic signals whose logic levels continuously depend on the phase accumulation values supplied by the first phase accumulator according to a first multi-phase correspondence matrix between the T possible phase accumulation discrete values and the T first signals;

the feedback loop is configured to provide, to the phase comparison block, T second distinct logic signals whose logic levels continuously depend on the phase accumulation values supplied by the second phase accumulator according to a second multi-phase correspondence matrix between the T possible phase accumulation discrete values and the T second signals; and the phase comparison block comprises T phase comparator with logic gates respectively receiving in continuous time the T first logic signals on T first comparison inputs and the T second logic signal on T second comparison inputs.

Thus, it is no longer necessary to manage the subtraction of a modulo value since this can be done implicitly and automatically by taking into account the T possible phase accumulation discrete values in each multi-phase correspondence matrix with the T first or T second logic signals. Indeed, each phase jump corresponds to an equivalent jump in the rows or columns of the matrix, with a return to the start of rows or columns as soon as the maximum value or modulo T is reached, and the number of logic signals is equal to this modulo value. It is therefore all the more not necessary to manage for synchronization of modulo value subtraction between signals to be compared.

Furthermore, producing 2T logic signals continuously dependent on the supplied phase accumulation values provided by the phase accumulators and comparing them with the aid of logic gates allows to dispense with a specific digital/analog conversion. In addition, it can be seen in practice that the frequency resolution does not depend on the number T of phase comparators in the comparison block.

This results in high resolution performance at least as satisfactory as in patent document U.S. Pat. No. 9,509,320 B2 with a greater simplicity of implementation by removing any synchronization constraint.

Optionally:

the servo circuit comprises a first multi-phase converter between the first phase accumulator and the phase comparison block, configured to implement the first multi-phase correspondence matrix; and the feedback loop comprises a second multi-phase converter between the second phase accumulator and the phase comparison block, configured to implement the second multi-phase correspondence matrix.

Also optionally, each of the first and second multi-phase converters implements its multi-phase correspondence matrix in the form of a set of logic gates receiving as input a current value of phase accumulation binary coded on $\ln(T)/\ln(2)$ bits, where $\ln(.)$ is the natural logarithm function, and providing at output T current values of logic levels.

Also optionally, each coefficient of each of the first and second multi-phase correspondence matrices is either at a first binary value indicative of a first logic level of logic signal, or at a second binary value indicative of a second logic level of logic signal.

Also optionally, each row or column of each of the first and second multi-phase correspondence matrices, when this row or column indicates the logic levels which one of the T first or second logic signals must take for the T possible phase accumulation discrete values, circularly presents by modulo T only one transition from the first binary value to the second binary value for a first half of the T possible phase accumulation discrete values and only one transition from the second binary value to the first binary value for a second half of the T possible phase accumulation discrete values.

Also optionally, each row or column of each of the first and second multi-phase correspondence matrices, when this row or column indicates the logic levels which one of the T first or second logic signals must take for the T possible phase accumulation discrete values, differs from that which precedes or from that which follows only by an shift of a column or respectively of a line modulo T of the coefficient values it contains, this shift remaining in the same direction from the first to the last row or column.

Also optionally, each of the first and second correspondence matrices is symmetrical.

Also optionally, the first and second correspondence matrices are identical.

Also optionally, the phase comparison block comprises T charge pumps receiving respectively in continuous time T pairs of pulse signals supplied by the T phase comparators and respectively providing in continuous time T output currents.

Also optionally, the phase comparison block includes a current summator receiving in parallel the T output currents supplied by the T charge pumps to provide a single summed current at the output of the phase comparison block.

BRIEF DESCRIPTION OF THE DRAWINGS

The invention will be better understood with the aid of the following description, given solely by way of example and made with reference to the appended drawings wherein:

FIG. 5 is a spectrum on a logarithmic scale of frequencies illustrating the characteristics of a signal obtained using the device of FIG. 1, FIG. 6 is a spectrum on a logarithmic scale of frequencies illustrating the characteristics of another signal obtained using the device of FIG. 1.

DETAILED DESCRIPTION

Figure 1:
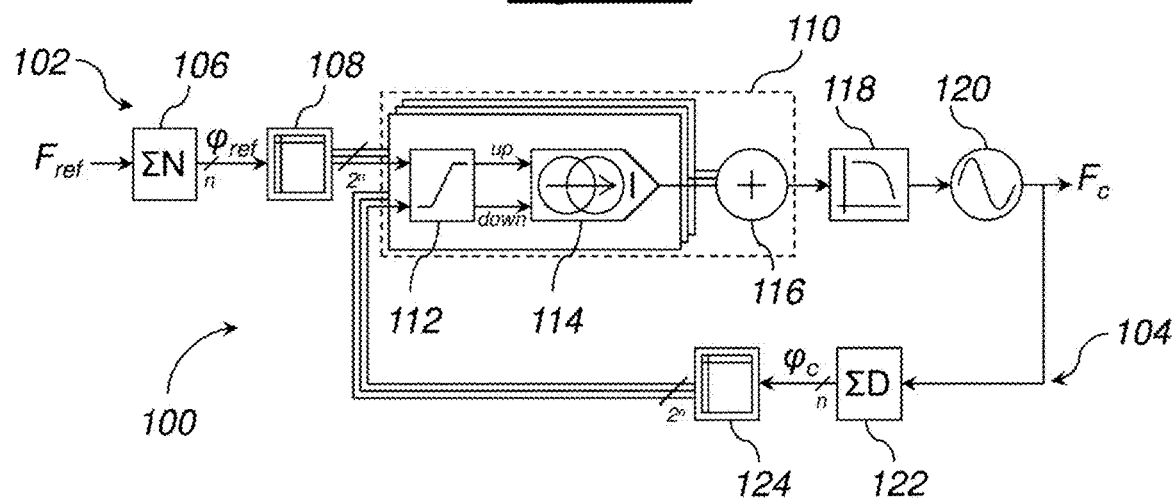
FIG. 1 schematically represents the general structure of a feedback-loop frequency synthesis device, according to a first embodiment of the invention.

FIG. 1 schematically represents a device 100 for frequency synthesis of the PLL type, according to a first embodiment of the invention. This device 100 has an input intended to receive a periodic signal oscillating at a reference frequency $F_{ref}$ and an output intended to provide a periodic signal oscillating at an output frequency $F_c$.

It further comprises a servo circuit 102 for controlling the output frequency $F_c$ by the reference frequency $F_{ref}$ and a feedback loop 104 for supplying information from the periodic output signal to the servo circuit 102.

More specifically, the servo circuit 102 connects the input to the output of the device 100 and comprises:
- a first phase accumulator 106 clocked at a frequency linked to the reference frequency $F_{ref}$: in the example of FIG. 1, the clock is directly that of the frequency $F_{ref}$ and the phase accumulator 106 has an integer value phase increment denoted N in an ordered set of T possible phase accumulation discrete values;
- a first multi-phase converter 108 disposed at the output of the first phase accumulator 106, receiving an encoded value of accumulated phase $\varphi_{ref}$ provided by the first phase accumulator 106 and providing T first logic signals whose logic levels depend in continuous time of this phase value $\varphi_{ref}$ according to a first multi-phase correspondence matrix between the T possible phase accumulation discrete values and the T first signals: according to a simple and preferred embodiment, T is a power of 2, $T=2^n$, and the accumulated phase value $\varphi_{ref}$ supplied by the first phase accumulator 106 is coded from 1 to T on n bits as illustrated in FIG. 1;
- a phase comparison block 110 comprising: T phase comparators 112 with logic gates respectively receiving in continuous time the first T logic signals on T first comparison inputs and respectively providing in continuous time T signal pairs "up" and "down"; T charge pumps 114 receiving respectively in continuous time the T pairs of "up" and "down" signals supplied by the T phase comparators 112 and respectively providing in continuous time T output currents; and a current summator 116 receiving in parallel the T output currents supplied by the T charge pumps 114 to supply a single summed current at the output of the phase comparison block 110;
- a loop filter 118 disposed at the output of the phase comparison block 110 for receiving the summed current: in the example of FIG. 1, it is an analog filter; and
- a frequency-controlled oscillator 120 arranged at the output of the loop filter 118 and providing the periodic signal that oscillates at the output frequency: in the example of FIG. 1, the oscillator 120 is of VCO type, that is to say controlled by analog voltage supplied by the loop filter 118.

More specifically also, the feedback loop 104 recovers the periodic signal supplied by the oscillator 120 to supply it at the input of a second phase accumulator 122 clocked at a frequency linked to the output frequency $F_c$: in the example of FIG. 1, the clock is directly that of the frequency $F_c$ and the phase accumulator 122 has an integer value of phase increment denoted D in the aforementioned ordered set of T possible phase accumulation discrete values. The feedback loop 104 further comprises a second multi-phase converter 124 disposed at the output of the second phase accumulator 122, receiving an encoded value of accumulated phase $\varphi_c$ supplied by the second phase accumulator 122 and supplying T second logic signals whose logic levels depend in continuous time on this phase value $\varphi_c$ according to a second multi-phase correspondence matrix between the T possible phase accumulation discrete values and the T second signals: according to the simple and preferred implementation mentioned previously, the accumulated phase value $\varphi_c$ supplied by the second phase accumulator 122 is coded from 1 to T on n bits as illustrated in FIG. 1.

The T second logic signals provided at the output of the second multi-phase converter 124 are respectively received on T second comparator inputs of the phase comparators 112.

In the nonlimiting example of FIG. 1, the multi-phase converters 108 and 124 are shown as devices different from the phase accumulators 106 and 122. But they could alternatively be incorporated in the accumulators, which would then directly supply the T first and second logic signals to the phase comparison block 110.

In practice, it will also be noted that the current summator 116 can be implemented in the simple form of an electrical connection of the T charge pump outputs 114.

A phase accumulator is, in general, a device clocked according to a predetermined clock frequency for incrementing, by a predetermined phase increment value, a digital value supplied at output at each rising or falling edge of the clock.

Figure 2:
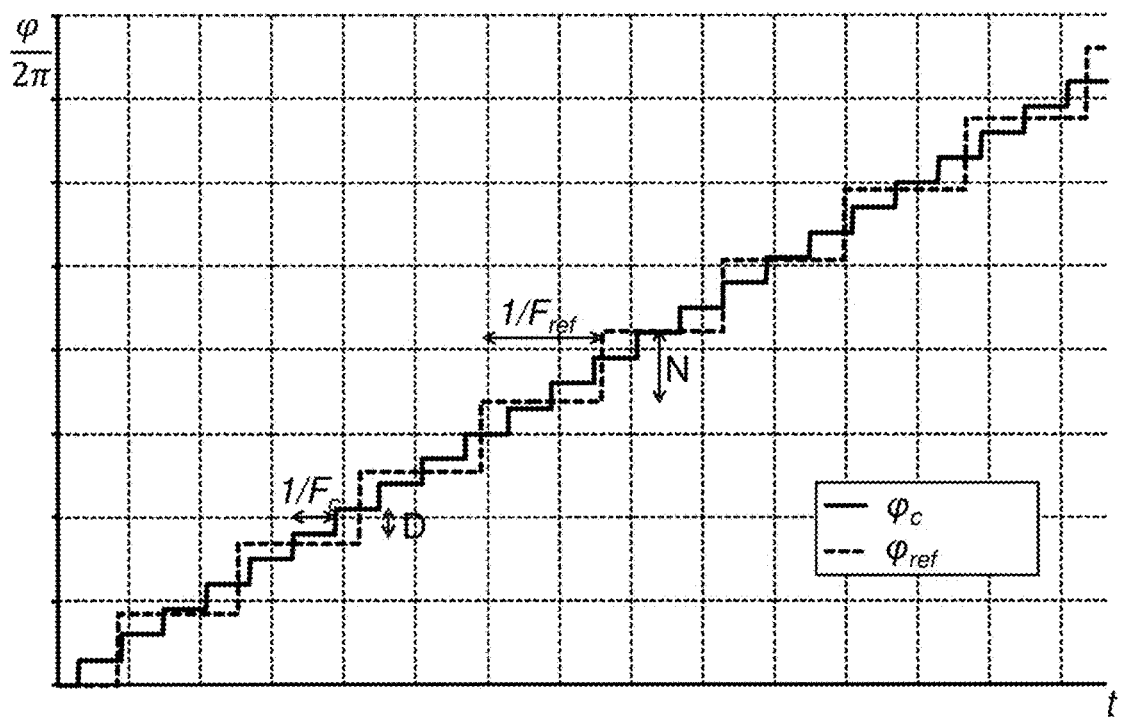
FIG. 2 is a timing diagram illustrating the changes in phase accumulation values obtained using the device of FIG. 1.

Thus, as illustrated in FIG. 2 by the dashed line curve for the first phase accumulator 106 (clocked by $F_{ref}$ and with a phase increment value N), the digital accumulated phase value $\varphi_{ref}$ is proportional to a theoretical rectilinear time ramp of slope $2\pi \cdot N \cdot F_{ref}$. In reality, it is sampled at the frequency $F_{ref}$ and takes successive digital values N·i at successive times $t_j$ where i is the index of the successive samples.

Thus also, as illustrated in FIG. 2 by the solid line curve for the second phase accumulator 122 (clocked by $F_c$ and with a phase increment value D), the digital accumulated phase value $\varphi_c$ is proportional to a theoretical rectilinear time ramp of slope $2\pi \cdot D \cdot F_c$. In reality, it is sampled at the frequency $F_c$ and takes successive digital values D·j at successive times $t_j$ where j is the index of the successive samples.

In theory, at each instant t:

$$[(\varphi_{ref} - \varphi_c)(t) = 2\pi \cdot t \cdot (N \cdot F_{ref} - D \cdot F_c)]. \quad \text{[Math. 1]}$$

Using the phase comparison block 110, when the PLL is locked, the relationship $F_c = \alpha \cdot F_{ref} = N/D \cdot F_{ref}$ is found theoretically.

But in practice, the instants t and t are not synchronized with one another and do not allow a direct comparison of the samples of accumulated phases.

It is therefore advantageous and clever to:
continuously convert the accumulated phase digital value $\varphi_{ref}$ into T first distinct logic signals using the first multi-phase converter 108 (or directly in the phase accumulator 106),
continuously convert the accumulated phase digital value $\varphi_c$ into T second distinct logic signals using the second multi-phase converter 124 (or directly in the phase accumulator 122), and
compare the 2T resulting logic signals two by two using the phase comparison block 110 with T logic comparators in continuous time and T charge pumps whose outputs are summed.

Indeed, by proceeding in this way by multi-phase conversions rather than by an attempt to resynchronize samples of accumulated phases, or rather than by a direct comparison of phases of analog signals without prior calculation of these phases, a phase comparison completely independent of the update frequencies of the phase accumulation values to be compared is obtained. It therefore becomes possible to design a frequency synthesis device with a multiplying factor $\alpha = N/D$ with a high value for D, therefore with high frequency resolution, without detrimental consequences on the establishment of the operating mode and on the phase noises or others.

According to the embodiment detailed above, the digital values of accumulated phases $\varphi_{ref}$ and $\varphi_c$ are respectively incremented with values N and D for each rising or falling edge of the corresponding clock, that is to say at instants $t_j$ for the digital value representing the accumulated phase $\varphi_{ref}$ and at instants $t_j$ for the digital value representing the accumulated phase $\varphi_c$. If nothing else was planned, these numerical values would be destined to grow indefinitely, which would then raise a problem of saturation of the accumulators. But the coding of values $\varphi_{ref}$ and $\varphi_c$ on a limited number n of bits and the multi-phase conversion carried out using a correspondence matrix with limited number T of rows and columns allow implicitly to realize a circular increment at modulo T of the values N and D according to which as soon as the T-th phase value is reached among the T possible values, one returns automatically to the first.

Figure 3:
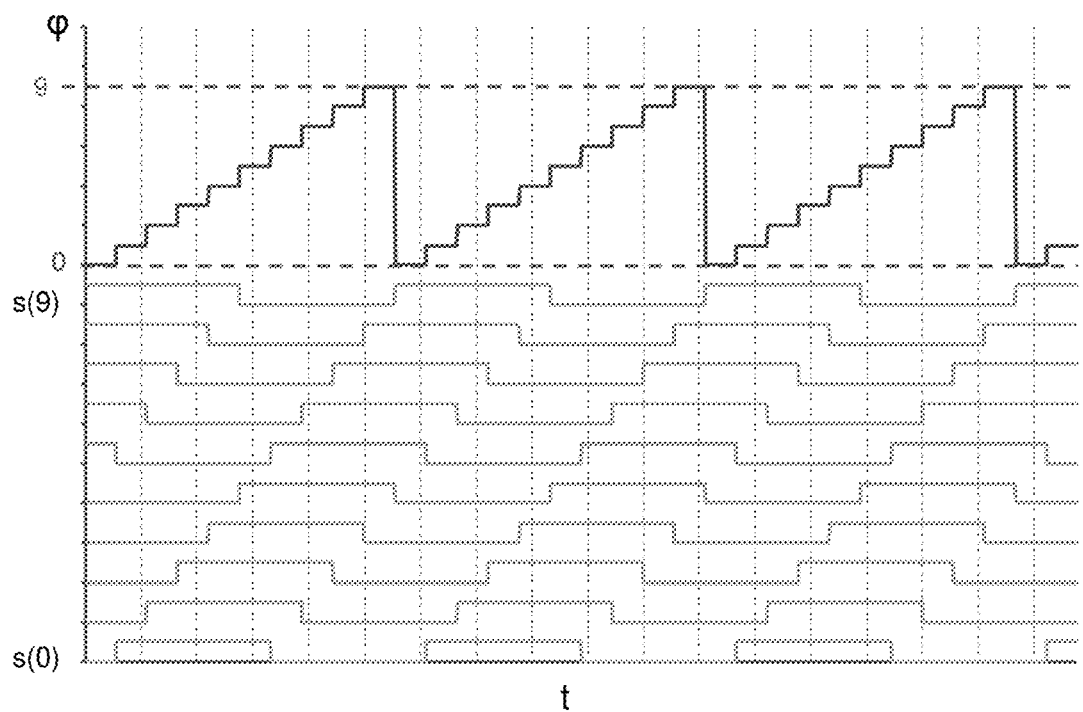
FIG. 3 is a timing diagram illustrating the changes in T first or second logic signals provided by the device in FIG. 1, depending on phase accumulation values obtained by unit jumps.
Figure 4:
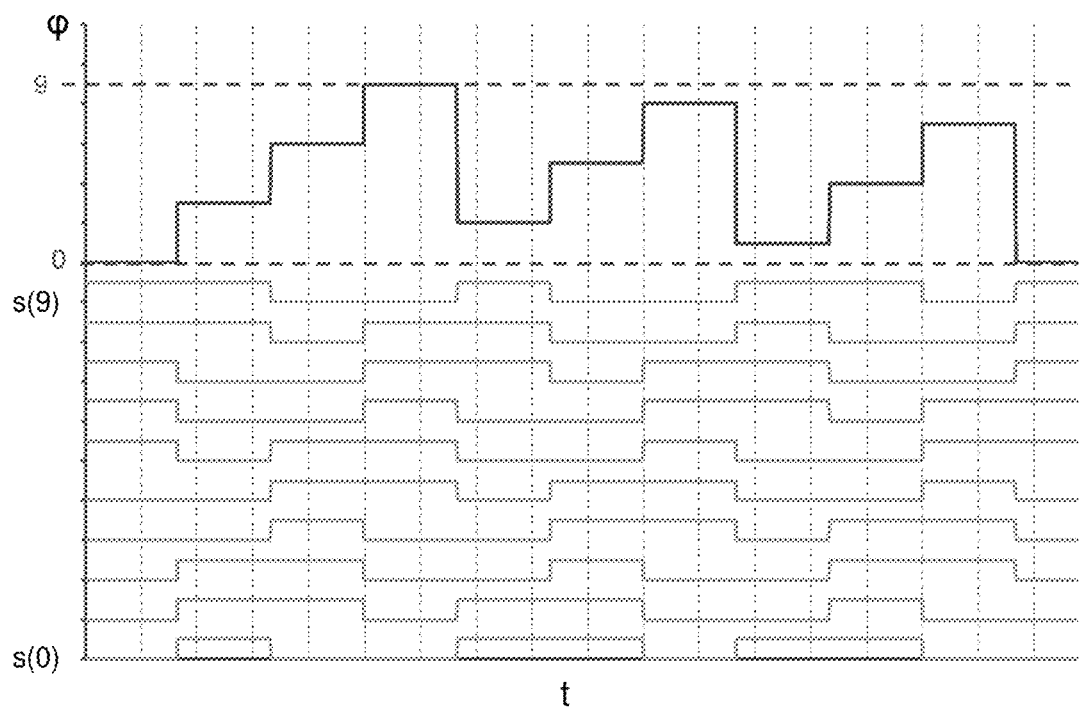
FIG. 4 is a timing diagram illustrating the changes in T first or second logic signals provided by the device in FIG. 1, depending on the phase accumulation values obtained by jumps of three units.

An example of multi-phase conversion for T=10 is illustrated by FIGS. 3 and 4 according to the following correspondence matrix, for example common to the first and second multi-phase converters:

TABLE 1

| $\varphi$ | s <9:0> |
|---|---|
| 0 | 1 1 1 1 1 0 0 0 0 0 |
| 1 | 1 1 1 1 0 0 0 0 0 1 |
| 2 | 1 1 1 0 0 0 0 0 1 1 |
| 3 | 1 1 0 0 0 0 0 1 1 1 |
| 4 | 1 0 0 0 0 0 1 1 1 1 |
| 5 | 0 0 0 0 0 1 1 1 1 1 |
| 6 | 0 0 0 0 1 1 1 1 1 0 |
| 7 | 0 0 0 1 1 1 1 1 0 0 |
| 8 | 0 0 1 1 1 1 1 0 0 0 |
| 9 | 0 1 1 1 1 1 0 0 0 0 |

T=10 phase accumulation discrete values are possible and encoded from 0 to 9. For each of these encoded values, the corresponding line of the correspondence matrix above indicates a logic level for each of the T logic signals constituting the digital signal s<9:0>, ordered in columns from s<9> to s<0>. In an advantageous embodiment, this logic level is binary, the logic signal being either at a first level denoted "0", or at a second level denoted "1".

FIG. 3 is thus a timing diagram illustrating the time trends of the T first or second logic signals s<0> to s<9> provided by the first or second multi-phase converter 108 or 124 using the correspondence matrix above, depending on phase accumulation values $\varphi = \varphi_{ref}$ or $\varphi_c$ successively obtained by unitary jumps, that is to say for N or D equal to 1. More precisely, in this timing diagram $\varphi$ successively takes the values 0, 1, 2, 3, 4, 5, 6, 7, 8, 9, 0, 1, 2, 3, 4, 5, 6, 7, 8, 9, 0, 1, 2, 3, 4, 5, 6, 7, 8, 9, 0, 1, . . . .

FIG. 4 is a timing diagram illustrating the time trends of the T first or second logic signals s<0> to s<9> supplied by the first or second multi-phase converter 108 or 124 using the same correspondence matrix above, depending on phase accumulation values $\varphi = \varphi_{ref}$ or $\varphi_c$ successively obtained by jumps of three units, that is to say for N or D equal to 3. More precisely, in this chronogram $\varphi$ successively takes the values 0, 3, 6, 9, 2, 5, 8, 1, 4, 7, 0, . . . .

More generally and by convention, each multi-phase correspondence matrix comprises T lines representative of the T possible phase accumulation discrete values and T columns representative of the T logic signals. According to another convention, it could comprise T columns representative of the T possible phase accumulation discrete values and T rows representative of the T logic signals. Advantageously, it is symmetrical, so that this convention is completely indifferent.

As shown in FIGS. 3 and 4, in order to have the logic signals resulting from multi-phase conversions fully relevant to compare two by two, it is advantageous that each column of each multi-phase correspondence matrix, each column indicating by convention the logic levels which one of the T resulting logic signals must take for the T possible phase accumulation discrete values, presents circularly by modulo T only a single transition from the first binary logic value to the second binary logic value for a first half of the T possible phase accumulation discrete values and only a single transition from the second binary logic value to the first binary logic value for a second half of the T possible phase accumulation discrete values. It is also advantageous that each column differs from the one preceding or from that which follows only by a shift of a line modulo T of the coefficient values that it contains, this shift remaining in the same direction from the first to the last column.

On a spectral point of view, before the multi-phase conversion of the phase accumulation values provided by the two phase accumulators 106 and 122, the two digital signals received by the phase comparators 112 of phase comparison block 110 have a frequency response very close to a straight line which starts from the zero frequency and which decreases with the frequency.

In this regard, FIG. 5 illustrates, on a logarithmic frequency scale, the frequency response of one of the digital signals resulting from the accumulation of a phase ramp generated by a phase accumulator sampled by a clock signal of frequency $F_H$ equal to 1 MHz. The spectrum illustrated in this figure is thus parasitized by the frequency $F_H$ and its harmonics, a phenomenon which is well known to those skilled in the art. However, the equivalent sampling carried out by the phase accumulator does not generate spectrum aliasing or quantization noise because it is applied identically to each rising or falling edge of the clock.

Furthermore, as the logic comparison carried out by each phase comparator 112 is a linear operation in continuous time, the spectrum of the result of this operation is a subtraction of the spectra of the two digital signals resulting from the phase accumulation values $\varphi_{ref}$ and $\varphi_c$ without adding additional noise.

FIG. 6 thus illustrates, on a logarithmic scale of frequencies, the resulting spectrum at the output of the current summator 116 for the experimental values of FIG. 5. When the PLL loop stabilizes, the straight lines of the frequency responses tend to compensate each other (here at −140 dB). Only the parasitic peaks of the fundamental frequencies $F_{ref}$, $F_c$ and their harmonics emerge. When the multiplying factor α is greater than 1, the first parasitic peak is at the frequency $F_{ref}$ while in a conventional frequency synthesis device with integer division and frequency dividers, it would be at the frequency $F_{ref}/D$. This is an important improvement which makes it possible either to increase the cut-off frequency of the frequency synthesis device under the condition of stability by thereby improving the time Δt for establishing its operating mode, or to much better attenuate interference and phase noise without deteriorating this time Δt.

It also clearly appears that the frequency synthesis device 100 as described above makes it possible to obtain a multiplying factor α=N/D with a high value for D and therefore with high frequency resolution. Indeed, the phase accumulators 106 and 122 can easily be implemented with means for storing numbers encoded in binary form, in particular for positive integer values such as N and D. They must therefore just provide a sufficient number of bits for performing the arithmetic operations of accumulation of N and D in the set of T possible phase accumulation values. This number n must be greater than or equal to the number of bits necessary to represent, not only N and D, but also T.

As a conclusion, the minimum number of bits necessary at the output of accumulators 106 and 122 can be defined by the following relation, an additional bit being necessary because of the multi-phase conversion:

$$n = \text{ENT}[\log_2(\text{MAX}(N-1, D-1))] + 2, \quad \text{[Math. 2]}$$

where ENT[ ] is the Floor Part function, ENT[ ]+1 then representing the Ceiling Part function, and where MAX ( ) is the function which returns the maximum between two values.

Figure 7:
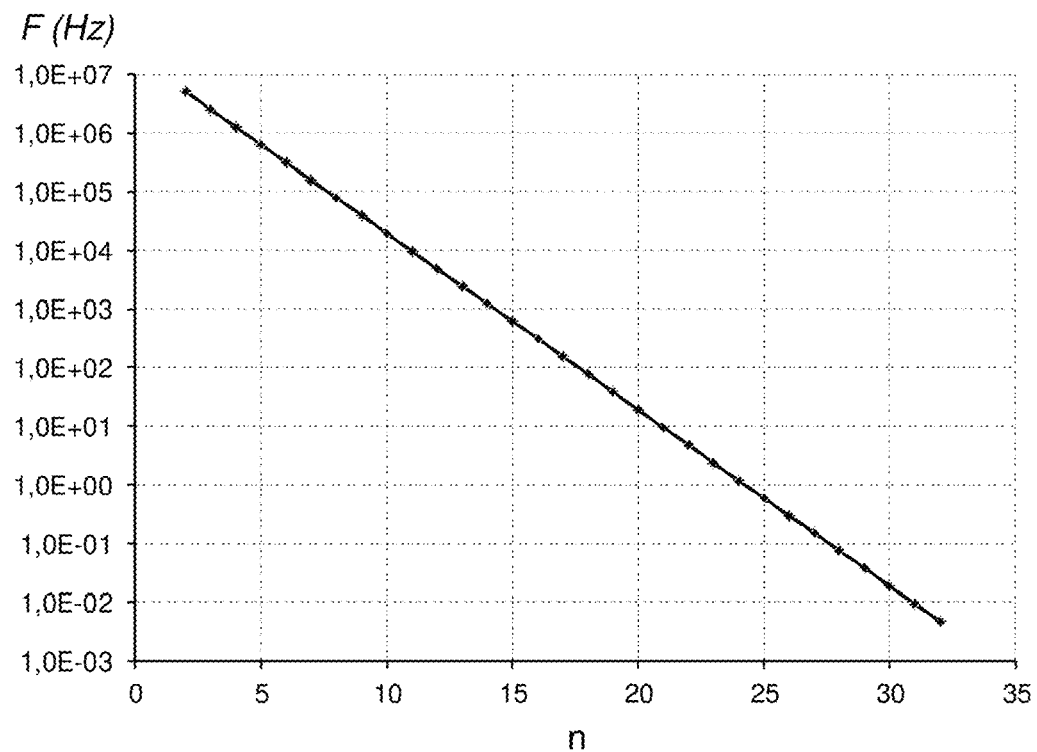
FIG. 7 is a diagram indicating a change in frequency resolution of the device in FIG. 1 as a function of a number n of bits coding T possible phase accumulation values, FIG. 8 schematically represents the general structure of a feedback-loop frequency synthesis device, according to a second embodiment of the invention, FIG. 9 schematically represents the general structure of a feedback-loop frequency synthesis device, according to a third embodiment of the invention.

In accordance with these calculations, the possibilities for choosing the values of D and N for given values of α and $F_{ref}$ only depend on n. For n=32 for example, D can go up to $2^{31}-1$ (ditto for N), where a conventional integer frequency synthesis device has values of D limited to 100 or 1000. As shown by FIG. 7, which illustrates the frequency resolution as a function of the number of bits of D for $F_{ref}$=20 MHz, this is a significant increase in the frequency resolution of the possible variations $F_{ref}/D$ of the multiplying factor α that a device according to the invention can reach as a function of n. The resolution of a fractional steps frequency synthesis device may even be exceeded. For example, for a 10 MHz reference signal and n=32, the resolution in frequency is better than 0.005 Hz.

Conversely, for a given frequency resolution, since it is equal to $F_{ref}/D$, it is possible to increase $F_{ref}$ with D. This is useful for lowering the contribution of the reference signal to the phase noise at the output in the bandwidth of the frequency synthesis device. Indeed in such a device, this contribution is directly due to the function of multiplying the reference frequency by the multiplying factor α. More precisely, in the bandwidth, the contribution of the phase noise of the reference signal is increased by 20·log (α) in decibels. It is then advantageous to decrease α and therefore to increase $F_{ref}$ for a given $F_c$.

Figure 8:
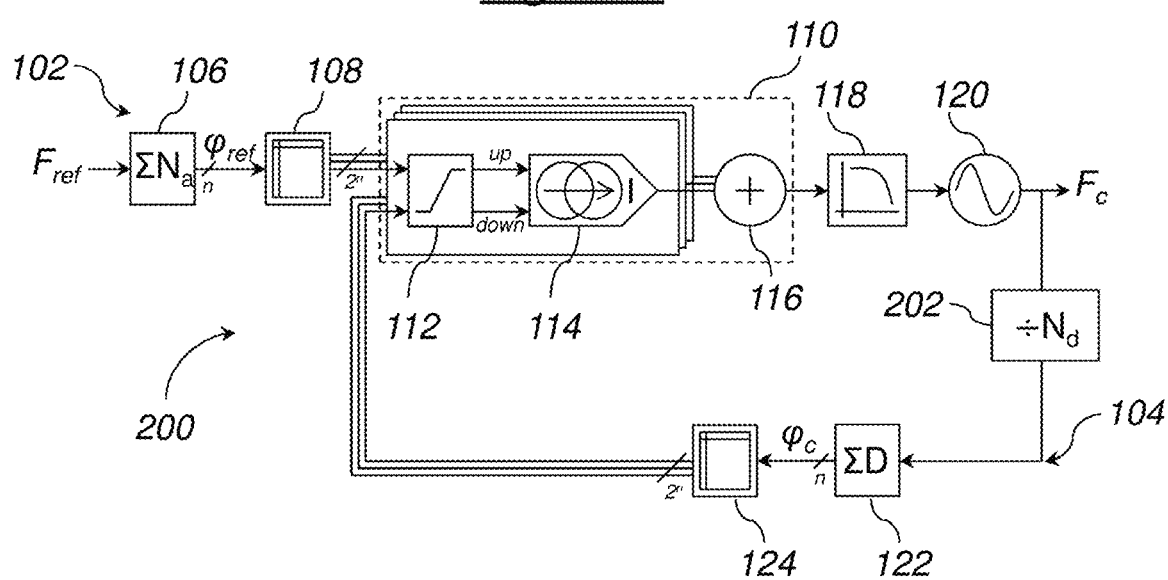

FIG. 8 diagrammatically represents a frequency synthesis device 200 of the PLL type, according to a second embodiment of the invention. This device 200 differs from device 100 in that it includes a frequency divider 202, disposed in the feedback loop 104 between the output and the second phase accumulator 122, and in that the phase increment value of the first phase accumulator 106 is adapted as a function of the value of the division factor of this frequency divider 202 for a desired servo factor of the output frequency $F_c$ by the reference frequency $F_{ref}$. More precisely, the value N is split into a product of two values $N_a$ and $N_d$, $N=N_a \cdot N_d$, $N_a$ representing the value of phase increment of the first phase accumulator 106 and $N_d$ the dividing factor of the frequency divider 202. We thus keep the relation $F_c = \alpha \cdot F_{ref} = N/D \cdot F_{ref} = N_a \cdot N_d/D \cdot F_{ref}$. Finally, it will be noted that the device 200 also differs from the device 100 in that the second phase accumulator 122 is no longer directly clocked at the output frequency $F_c$, but at the reduced frequency $F_c/N_d$ which however remains linked to $F_c$.

The advantage of this second embodiment compared to the previous one is to avoid too great a difference between the phase increment values of the two phase accumulators 106 and 122 by splitting the value of N into two integer factors. Indeed, knowing that it is often desired to have a multiplying factor α much greater than 1, the value of N is often much greater than that of D, so that, according to the calculation carried out previously with reference to the first two embodiment of FIGS. 1 and 3, the minimum number n=ENT[$\log_2$(MAX(N−1,D−1))]+2 is still dominated by the value of N and not by that of D. In this way, a certain number of bits for implementing the value D remain useless, all the more so when the factor α is large. However, useless implementation bits mean as many logic gates which consume power unnecessarily.

In the second embodiment of FIG. 8, the calculation of n becomes:

$$n = \text{ENT}[\log_2(\text{MAX}(N_a-1, D-1))] + 2. \quad \text{[Math. 3]}$$

Since $N_a$ is less than N, the number of useless implementation bits is reduced. Advantageously, the division factor $N_d$ can even be chosen so that, for a desired servo factor of the output frequency by the reference frequency α=N/D, the phase increment value D of the second phase accumulator 122 can be chosen as close as possible to the phase increment value $N_a$ of the first phase accumulator 106 while remaining less than or equal to the latter. In this case, few implementation bits are useless and the architecture is optimized in terms of power consumption. The clock frequencies $F_{ref}$ and $F_c/N_d$ of the two phase accumulators 106 and 122 also become close to each other, that of the second phase accumulator 122 being slowed down so as to further reduce consumption. This reduction is also not offset by the addition of the frequency divider 202. The optimum is reached for $ENT[\log_2(N_a-1)]=ENT[\log_2(D-1)]=n-2$. However, it is not interesting that the value $N_a$ is less than D, because in this case the first parasitic frequency in the output spectrum would no longer be $F_{ref}$ but $F_c/N_d$. This would then result in either a degradation of the time Δt for establishing the operating mode, or a degradation of the attenuation of the parasitic frequencies, depending on the cutoff frequency chosen for the loop filter 118.

The counterpart of this improvement in consumption is a frequency resolution loss which becomes $F_{ref}N_d/D$ rather than $F_{ref}/D$. It is therefore degraded by a factor $N_d$.

Figure 9:
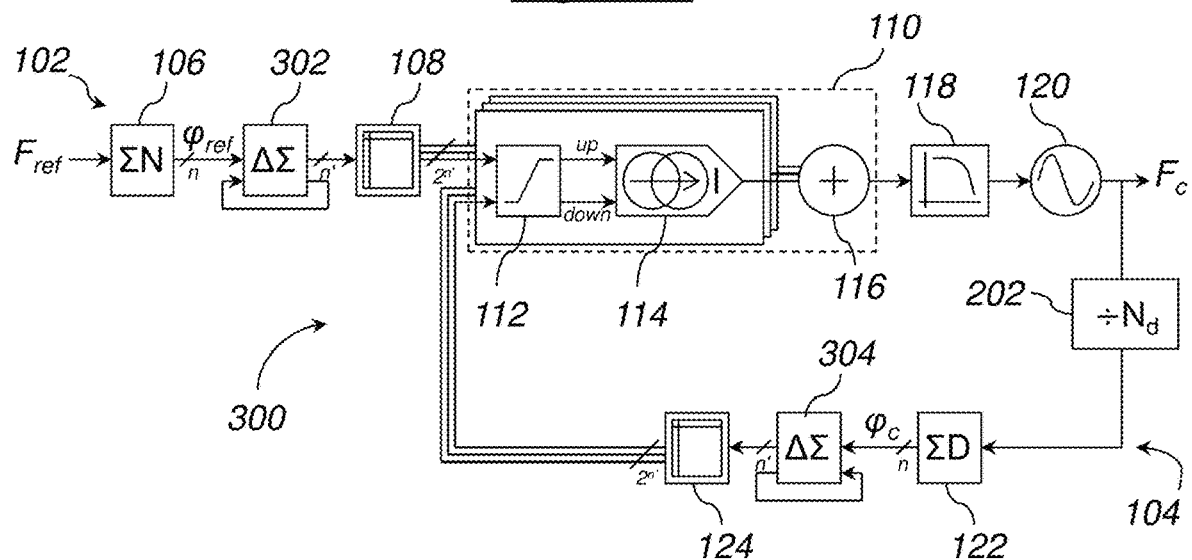

FIG. 9 schematically represents a device frequency synthesis 300 of the PLL type, according to a third embodiment of the invention. This device 300 differs from device 200 in that each multi-phase converter 108 or 124 is preceded by a dynamic reduction device by quantization. More precisely, this reduction in dynamics is for example carried out using a quantizer with Delta-Sigma modulation. Thus, a first Delta-Sigma modulation quantizer 302 is disposed between the first phase accumulator 106 and the first multi-phase converter 108. Similarly, a second Delta-Sigma modulation quantizer 304 is disposed between the second phase accumulator 122 and the second multi-phase converter 124.

This embodiment has the advantage of facilitating the implementation of the phase comparison block 110 by reducing the number of logic signals to be processed. Indeed, without reduction of dynamic range by quantization, for accumulated phase values coded on n bits at the output of the phase accumulators, the number of phase comparators 112 and charge pumps 114 is $T=2^n$ to process the $2T=2^{n+1}$ signals from the multi-stage converters 108 and 124. This number can become very large when n increases, that is to say when the frequency resolution is large.

Thus, the reduction in dynamics allows a reduction in the number of bits taken into account in the multi-phase converters, making the number of logic signals which they produce lower and the phase comparison block 110 which receives them simpler to make.

In general, to reduce the number of bits supplied at the input of multi-phase converters, the simplest solution consists in truncating the values to be converted on a number of bits n' less than n by removing the least significant bits. This truncation is mathematically equivalent to a new quantization of digital data. This quantization produces an error which is generally assimilated to noise, known as quantization noise. This noise has a fairly random spectrum but is often approached by a flat spectrum of white noise. The multi-phase converters then only need to convert n' bits into $2^{n'}$ logic signals at the cost of interferences which can be assimilated to additional noise in the output spectrum of the frequency synthesis device. Due to frequency control, this noise is mainly found around the cutoff frequency of the device, its standard deviation decreasing when n' increases.

The advantage of using a Delta-Sigma modulation quantizer to achieve dynamic reduction is to reduce this quantization noise, since the phase comparison block 110 is followed by a low-pass filter, in this case the loop filter 118. Indeed, the Delta-Sigma modulation function distorts the spectrum of quantization noise by generating less noise at low frequency and more noise at high frequency close to $F_{ref}$ and $F_c/N_d$. This noise is then better filtered by the loop filter 118 if the frequencies $F_{ref}$ and $F_c/N_d$ are sufficiently large compared to the cut-off frequency of the device. It will be noted that in practice the order of the filter must be strictly greater than that of the Delta-Sigma modulation. In this third embodiment, the loop filter 118 is therefore at least of order 2, knowing that in addition it cannot be of too high order, that is to say that it advantageously remains of order less than or equal to 3.

Figure 10:
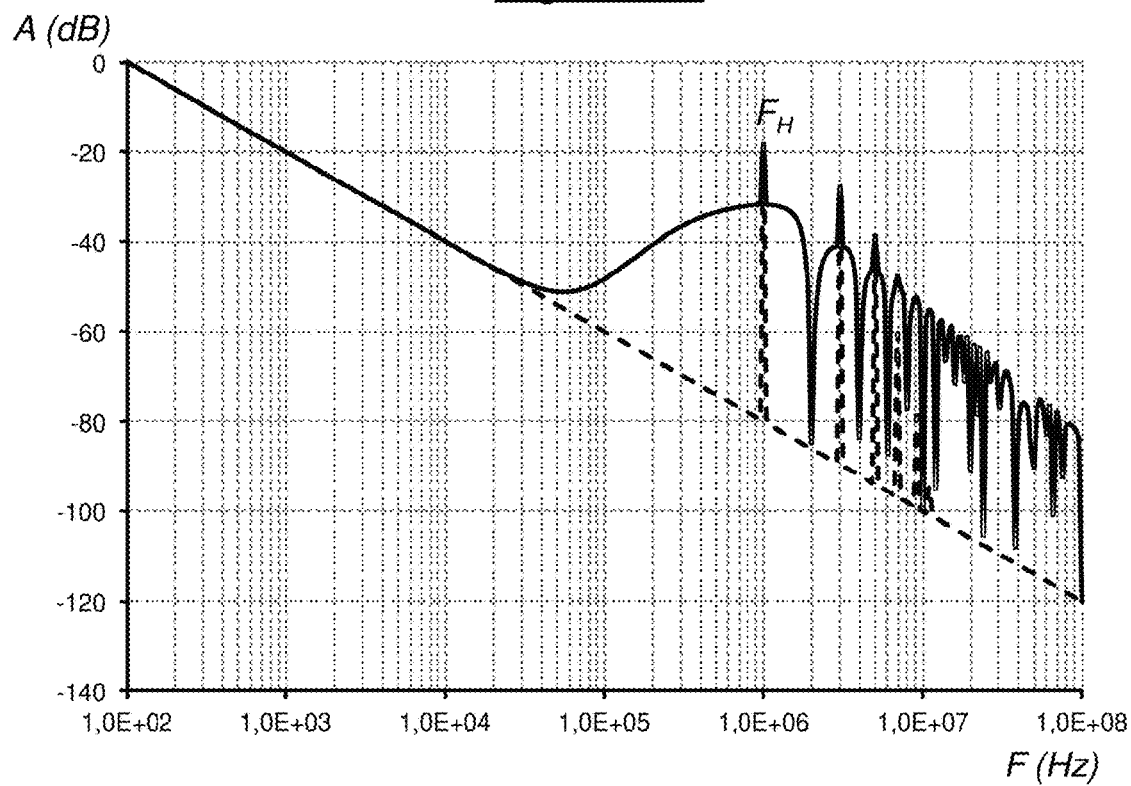
FIG. 10 is a spectrum on a logarithmic scale of frequencies illustrating the characteristics of a signal obtained using the device of FIG. 9.

By way of nonlimiting example, a Delta-Sigma modulation quantizer of order 1 is very simple to implement because it is always stable. It can consist of an adder followed by a register of n bits, the output of which is truncated by taking the n' most significant bits while the (n−n') remaining least significant bits are completed by 0s in most significant bits to obtain new data on n bits at the input. The value of the new data thus created represents the fraction which has been truncated at the output of the register. This value is added to the current input data item on n bits and the result is recorded in the register for the next cycle. This is how the delta-sigma modulation quantizer never erases the quantization error, but defers it in time FIG. 10 illustrates, on a logarithmic frequency scale, the frequency response of a digital signal resulting from:
  a phase ramp generated by a phase accumulator subjected to a clock signal of frequency $F_H$ equal to 1 MHz, and
  a reduction in dynamic range by quantization performed at the output of the accumulator using a Delta-Sigma modulation quantizer.

In addition to be parasitized by the frequency $F_H$ and its harmonics, the spectrum shown in this figure shows a quantization noise carried mainly around its parasite frequencies, without substantial change at low frequencies when compared to the spectrum of FIG. 5. This noise is intended to be filtered by the loop filter 118, and this all the better for $F_{ref}$ is large relative to the cut-off frequency of the device. Since a frequency synthesis device according to the invention makes it possible to easily increase the reference frequency with a constant multiplying factor α, it also stands out from the point of view of the use of a Delta-Sigma modulation, of a fractional step frequency synthesis device in which this reference frequency is more difficult to increase.

Figure 11:
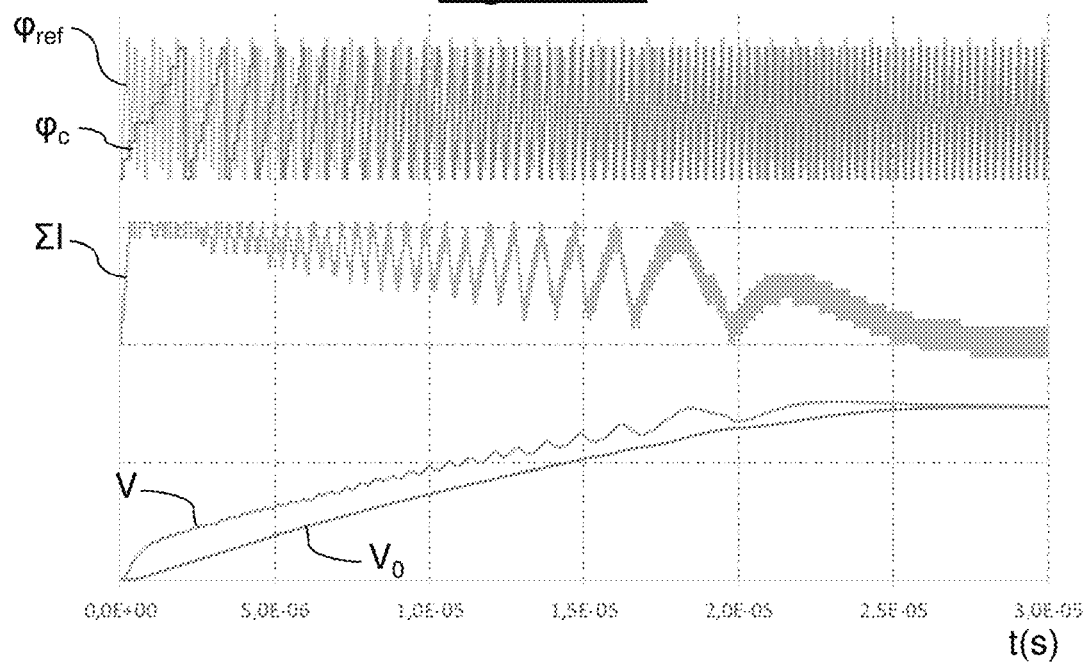
FIG. 11 is a set of three timing diagrams illustrating the evolutions of different quantities of the device of FIG. 1 in startup transient mode.
Figure 14:
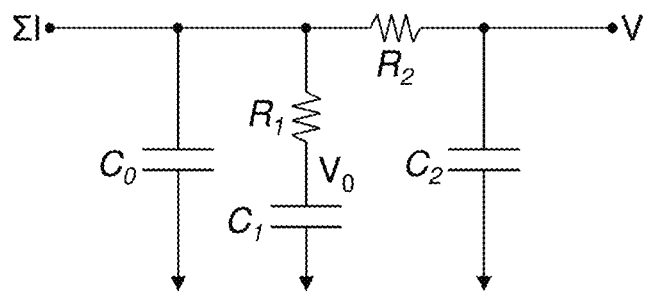
FIG. 14 represents another example of a loop filter for any of the devices in FIGS. 1, 8 and 9, FIG. 15 schematically represents the architecture of an example of a phase comparator for any of the frequency synthesis devices of FIGS. 1, 8 and 9.

FIG. 11 illustrates three timing diagrams of a transient mode startup of the frequency synthesis device 100, that is to say without frequency divider 202 and without Delta-Sigma modulation quantizer 302 or 304, for a ratio α=3/2, a loop filter of order 2 and T=16. The first timing diagram shows the evolution of the phase accumulation values $\varphi_{ref}$ and $\varphi_c$ whose ramps end up synchronizing before $3·10^{-5}$ seconds. The second timing diagram shows the stabilization of the summed current ΣI at the output of the current summator 116 at the same time. The third timing diagram shows the convergence of the analog voltage V supplied by the loop filter 118 to the VCO oscillator 120 towards a stabilization value at the same time. The voltage $V_0$ is an internal voltage of the loop filter 118 which is indicated in FIG. 14.

Figure 12:
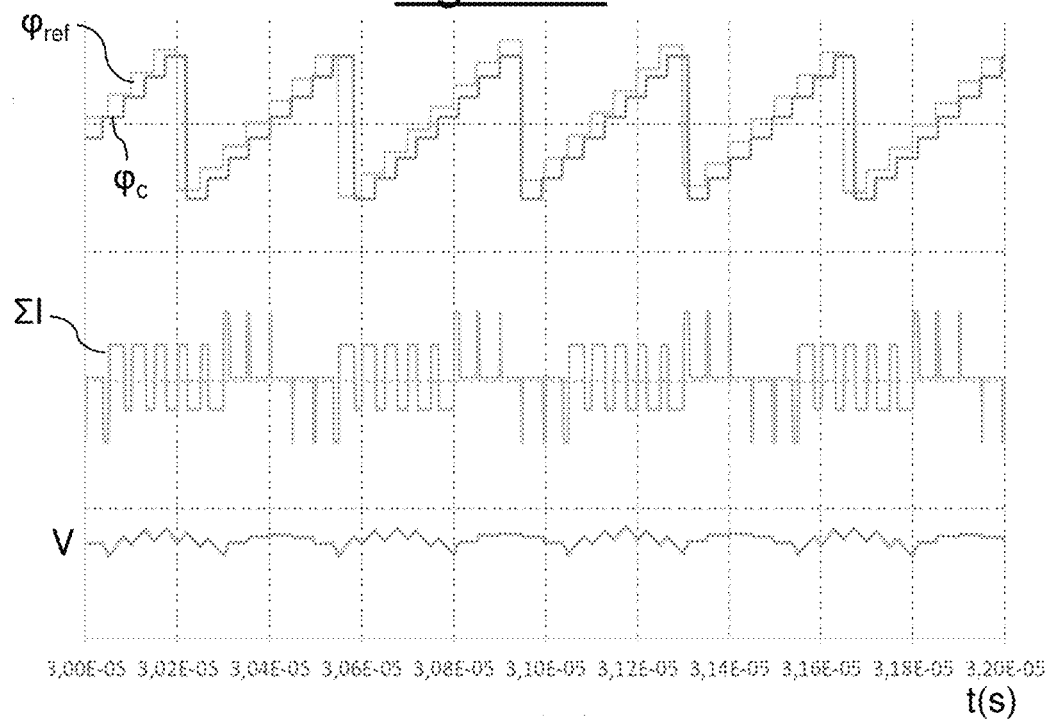
FIG. 12 is a set of three timing diagrams illustrating the evolutions of different quantities of the device in FIG. 1 in established operating mode.

FIG. 12 illustrates the same three chronograms in steady state of the frequency synthesis device 100, that is to say from $3·10^{-5}$ seconds, according to a finer time scale. It can be noticed more clearly the synchronization of the phase ramps $\varphi_{ref}$ and $\varphi_c$, as well as the stabilized convergence of $\Sigma I$ and V. The small remaining variations correspond to the residual interferences of the clock frequencies $F_{ref}$ and $F_c$ after filtering by the filter loop 118.

It clearly appears that a frequency synthesis device such as one of those described above has at least some of the following advantages, that of the third embodiment detailed above combining them all:

- high resolution in frequency for setting the output signal can be achieved and is practically not dependent on the reference frequency,
- contrary to fractional steps frequency synthesis devices, this high resolution in frequency is not obtained at the expense of a phase noise injected into the output signa,
- it behaves like a conventional integer-division frequency synthesis device with a very similar transfer function, so that its study is simplified,
- The frequency $F_{ref}$ of the reference signal may be as large as desired, its contribution to the total phase noise at the output, $20 \cdot \log(\alpha)$, being reduced accordingly for a given output frequency $F_c$,
- the spurious signals present in the output spectrum are shifted towards the high frequencies, so that they are better filtered by the loop filter,
- its cut-off frequency can be increased within the limits of stability, so that the time to establish its operating mode can be reduced,
- the frequency resolution does not depend on the number T of phase comparators 112 and charge pumps 114 used in the phase comparison block 110, and
- no subtraction of modulo value and/or synchronization between the phase accumulators 106 and 122 is necessary.

In terms of industrial application, any of the devices described above can be integrated into any device requiring frequency synthesis, such as for example a radio frequency receiver or transmitter, a clock for clocking digital, analog or mixed (i.e. analog and digital) circuits, a clocked measurement system, a time base, etc.

Concrete examples of electronic architectures for each of the functional elements constituting the frequency synthesis devices described above will now be given.

Figure 13:
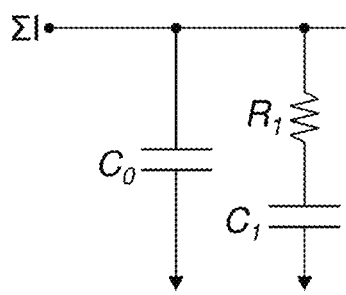
FIG. 13 represents an example of a loop filter for one or other of the devices in FIGS. 1 and 8.

FIG. 13 illustrates an example of order 1 filter which can be chosen to produce the loop filter 118 of one or other of the frequency synthesis devices of FIGS. 1 and 8. This order 1 filter receives the summed analog current $\Sigma I$ from the phase comparison block 110 as input and supplies the analog control voltage V to the VCO oscillator 120 as output. It further comprises a first capacitive circuit $C_0$ connecting the input to ground to perform an integration function by inserting a pole at zero frequency (PLL type II). It further comprises a second resistive and capacitive circuit $R_1$, $C_1$ connecting the output to ground to create a phase margin by inserting a zero at low frequency. This order 1 filter cannot be used in the frequency synthesis device of FIG. 9 since it cannot be of order strictly higher than that of the Delta-Sigma quantizers 302 and 304.

FIG. 14 illustrates an example of order 2 filter which can be chosen to make the loop filter 118 of any of the frequency synthesis devices of FIGS. 1, 8 and 9. This order 2 filter differs from the filter of FIG. 13 in that a third resistive circuit $R_2$ is interposed between the second circuit $R_1$, $C_1$ and the output, and in that a fourth capacitive circuit $C_2$ connects the output to ground. These two additional circuits add a pole beyond the cut-off frequency of the filter.

Figure 15:
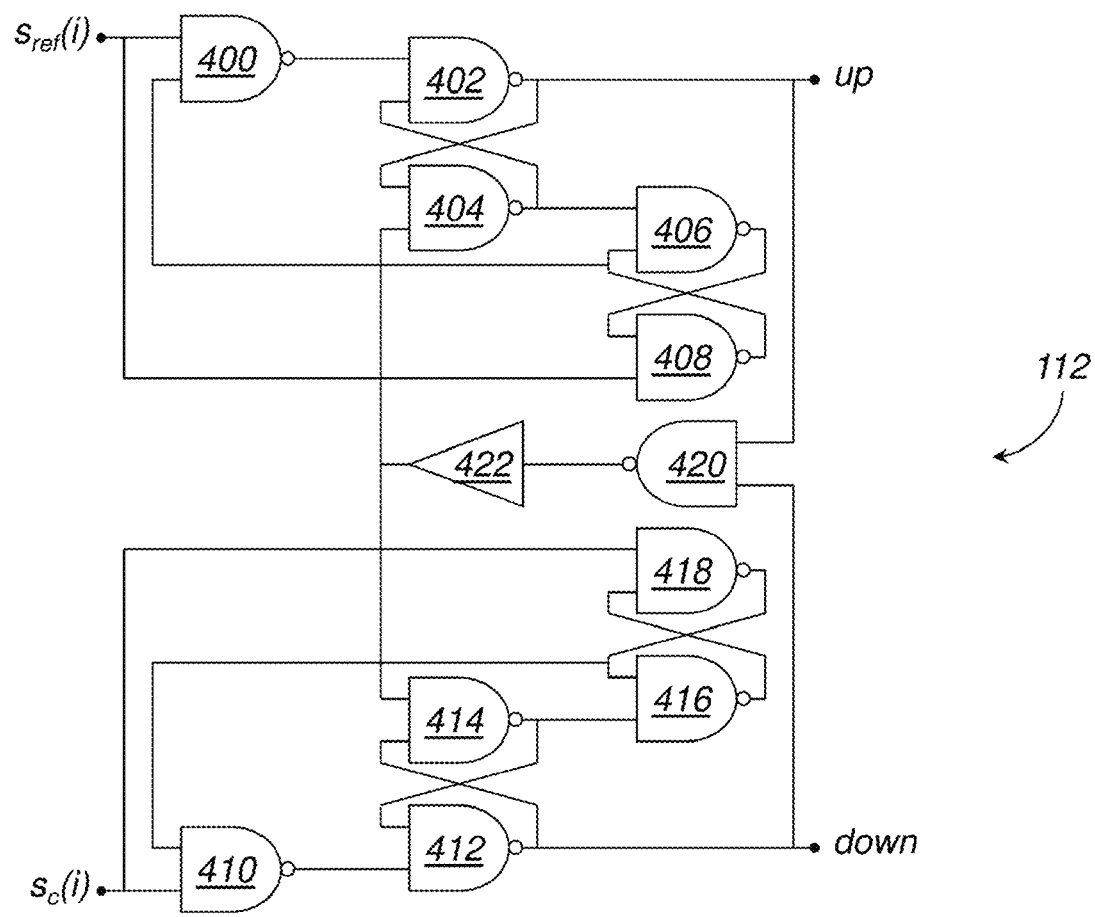

FIG. 15 schematically represents the general architecture, in terms of logic gates, of an example of phase comparator 112 adapted for the frequency synthesis device of FIG. 1, 8 or 9.

This phase comparator has a first comparison input which receives one of the T first logic signals supplied by the first multi-phase converter 108. This signal is denoted $s_{ref}(i)$, with $0 \leq i < T$, and its logic level is updated at the frequency $F_{ref}$. The comparator has a second comparison input which receives one of the T second logic signals supplied by the second multi-phase converter 124, more precisely that of the same index as $s_{ref}(i)$. This signal is noted $s_c(i)$ and its logic level is updated at the frequency $F_c$ (or $F_c/N_d$).

The first logic signal $s_{ref}(i)$ is received at the input of a NAND logic gate 400 whose output is supplied at the input of a NAND logic gate 402 of a first RS flip-flop having two NAND logic gates 402 and 404. The output of NAND logic gate 402 provides the "up" signal of the phase comparator 112 and is further returned to the input of NAND logic gate 404. The output of the NAND logic gate 404 is supplied at the input of a NAND logic gate 406 of a second RS flip-flop having two NAND logic gates 406 and 408 and is further returned to the input of the NAND logic gate 402. The output of the NAND logic gate 406 is returned to the input of the NAND logic gate 408. The output of the NAND logic gate 408 is returned to the input of the NAND logic gate 406 and is further supplied at the input of the NAND logic gate 400. Finally, the first logic signal $s_{ref}(i)$ is also received at the input of the NAND logic gate 408.

The second logic signal $s_c(i)$ is received at the input of a NAND logic gate 410 whose output is supplied at the input of a NAND logic gate 412 of a third flip-flop RS having two NAND logic gates 412 and 414. The output of NAND logic gate 412 provides the "down" signal of the phase comparator 112 and is further returned to the input of NAND logic gate 414 The output of the NAND logic gate 414 is supplied at the input of a NAND logic gate 416 of a fourth flip-flop RS having two NAND logic gates 416 and 418 and is further returned to the input of the NAND logic gate 412. The output of the NAND logic gate 416 is returned to the input of the NAND logic gate 418. The output of the NAND logic gate 418 is returned to the input of the NAND logic gate 416 and is further supplied at the input of the NAND logic gate 410. Finally, the second logic signal $s_c(i)$ is also received at the input of the NAND logic gate 418.

The "up" and "down" signals are further supplied at the input of a NAND logic gate 420, the output of which is supplied at the inputs of the NAND logic gates 404 and 414 via a YES logic gate 422 (equivalent to a double NO logic gate).

Figure 16:
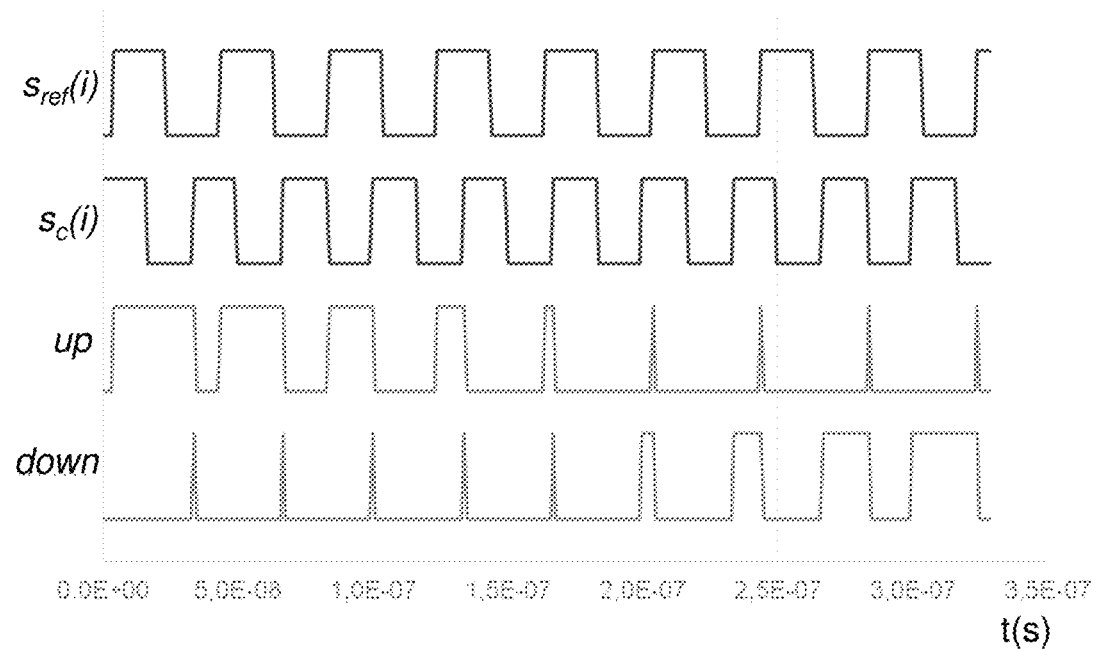
FIG. 16 is a set of four timing diagrams illustrating the evolutions in the logic signals at the input and at the output of the phase comparator of FIG. 15, FIG. 17 schematically represents the architecture of an example of a charge pump for any of the frequency synthesis devices of FIGS. 1, 8 and 9, FIG. 18 schematically represents the architecture of an example of a phase accumulator adapted for the frequency synthesis device of FIG. 1 or 8, FIG. 19 schematically represents the architecture of an example of a dynamic reduction by Delta-Sigma modulation phase accumulator adapted for the frequency synthesis device of FIG. 9, and FIG. 20 schematically represents the architecture of an example of a multi-phase converter for any of the frequency synthesis devices of FIGS. 1, 8 and 9.

FIG. 16 illustrates an example of a resulting timing diagram in which $F_{ref}=25$ MHz and $F_c=30$ MHz. In this type of comparator, the measured phase error is proportional to the width of the pulses generated on the "up" and "down" signals.

Figure 17:
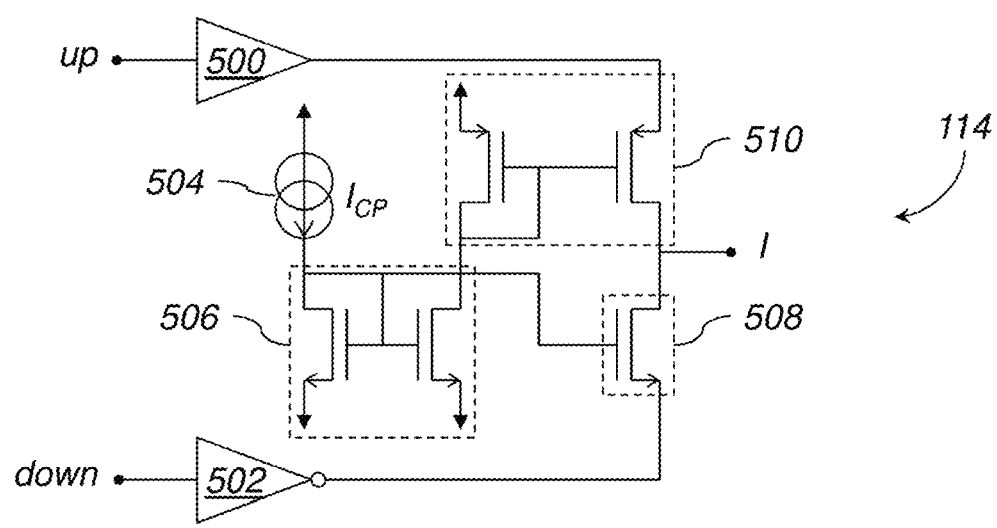

FIG. 17 schematically represents the general architecture of an example of a charge pump 114 adapted for the frequency synthesis device of FIG. 1, 8 or 9.

It receives the "up" signal at the input of a YES logic gate 500, the "down" signal at the input of a NO logic gate 502 and is biased by a current generator $I_{CP}$ 504. This current generator $I_{CP}$ 504 supplies a first current mirror 506 having two n-MOS transistors which copies the current $I_{CP}$ on a n-MOS output transistor 508. It also feeds a second current mirror 510 with two p-MOS transistors, one of which, called the output, is connected by its drain to the output of the YES logic gate 500. The drain of the n-MOS output transistor 508 is connected to the output of the NO logic gate 502. The output current I is taken between the output n-MOS transistor 508 and the output p-MOS transistor of the second current mirror 510.

In operation, the current $I_{CP}$ is copied by the first current mirror 506 on the output n-MOS transistor 508 when it is activated, that is to say when the "down" signal is at level "1", and on the output p-MOS transistor of the second current mirror 510 when it is activated, that is to say when the signal "up" is at level "1". When the signals "up" and "down" are both at level "1" at the same time, the currents of the output n-MOS and p-MOS transistors cancel each other at output I.

Figure 18:
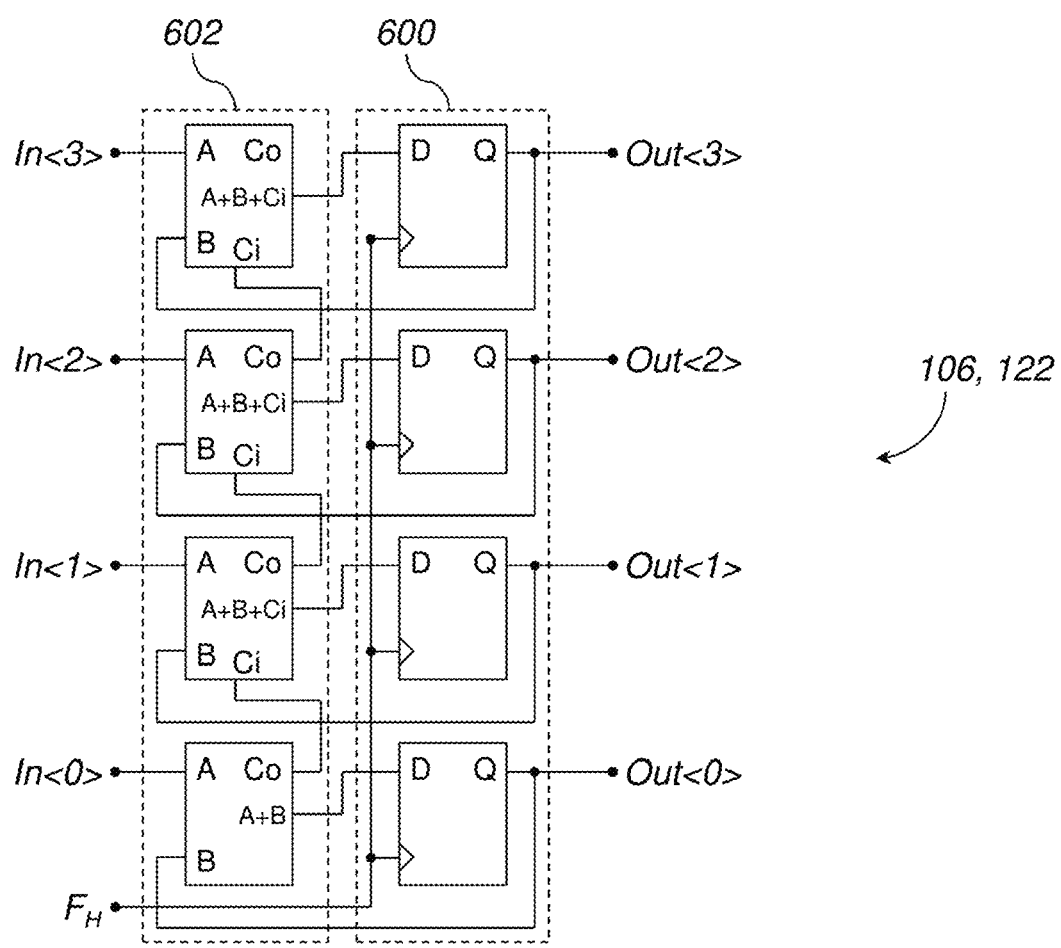

FIG. 18 schematically represents the general architecture of an example of phase accumulator 106 or 122 adapted for the frequency synthesis device of FIG. 1 or 8. This example is in particular adapted to a specific case according to which the values of phase increments N (or $N_a$) and D are coded on 4 bits and the registers In, Out occupy 4 bits of memory. The input register In stores the configuration value N (or $N_a$) for the phase accumulator 106 and the configuration value D for the phase accumulator 122.

This architecture includes a storage register 600 with four synchronous flip-flops clocked by the clock frequency $F_H$ ($F_{ref}$ for the phase accumulator 106 and $F_c$ for the phase accumulator 122). The four binary outputs of this register 600 feed the four bits Out<0>, Out<1>, Out<2>, Out<3> of the output register Out. The four binary inputs of this register 600 are supplied by a 4-bit adder 602 with four binary addition modules connected together in a conventional manner to carry out a 4-bit addition. The four bits In<0>, In<1>, In<2>, In<3> of the input register In feed four respective inputs of the binary addition modules of the adder 602, which also receive the four binary outputs of the storage register 600 to carry out the accumulation operation. The outputs of the four binary addition modules are supplied to the respective inputs of the four synchronous flip-flops of the storage register 600. It is noted that the modulo function of each phase accumulator 106, 122 is implicitly carried out by not using the carry of the most significant adder.

The architecture of each phase accumulator 106 or 122 is thus greatly simplified compared to that which must be envisaged in the patent document U.S. Pat. No. 9,509,320 B2.

Figure 19:
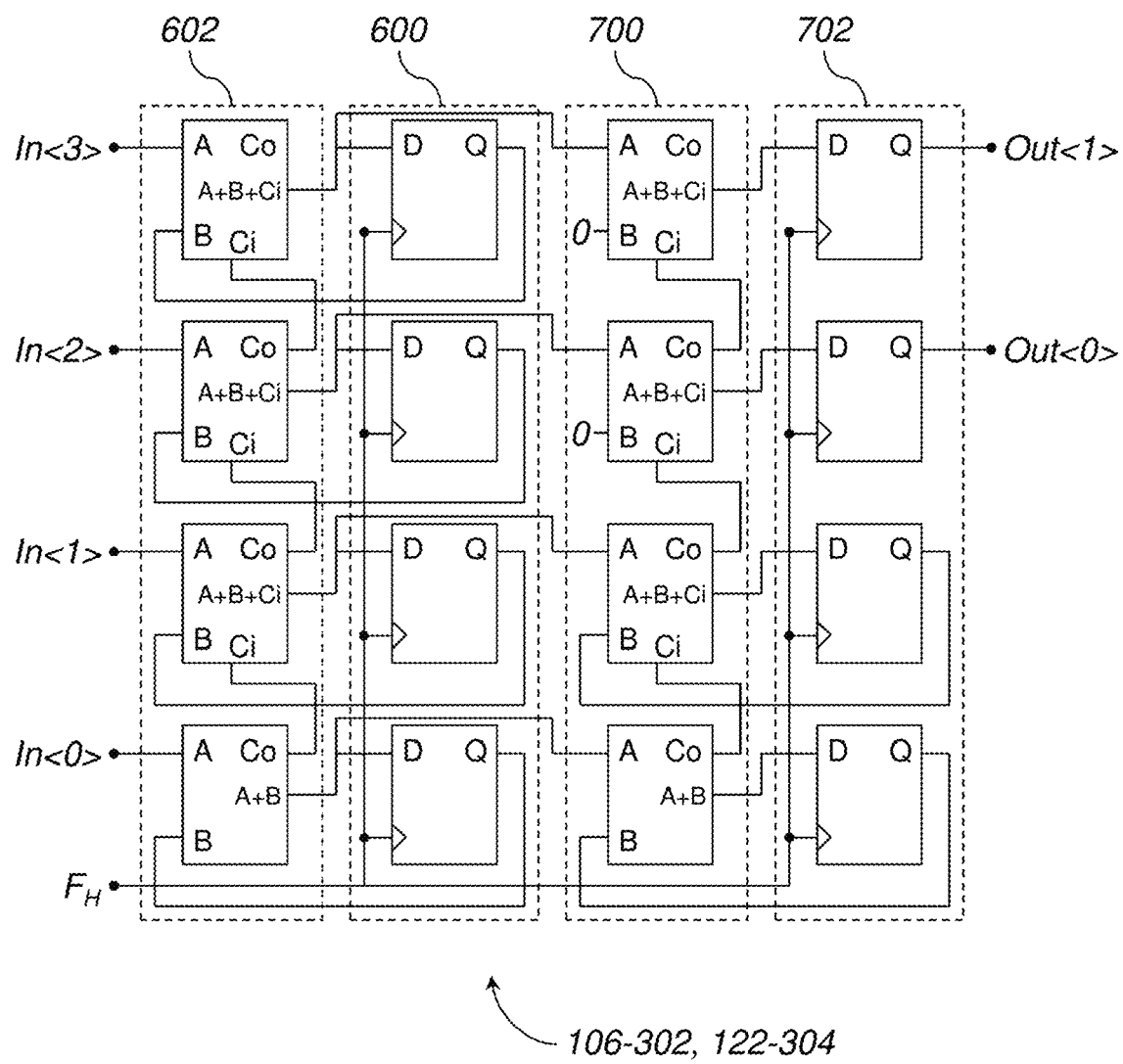

FIG. 19 schematically represents the general architecture of an example of phase accumulator 106 or 122 combined with a Delta-Sigma quantizer 302 or 304, adapted for the frequency synthesis device of FIG. 9. This example is in particular adapted to the specific case according to which the values of phase increments N (or $N_a$) and D are coded on 4 bits and the register In occupies 4 bits of memory. The input register In stores the configuration value N (or $N_a$) for the phase accumulator 106 and the configuration value D for the phase accumulator 122.

In accordance with this example, the phase accumulation function is performed by the storage register 600 and the 4-bit adder 602, arranged as previously in the example of FIG. 18. The dynamic reduction function using a Delta-Sigma modulation quantizer is performed by an additional 4-bit adder 700 and by an additional storage register 702, these two modules being interposed between the storage register 600 and the output Out reduced to 2 bits.

More specifically, the additional adder 700 comprises four binary addition modules connected together in a conventional manner to perform an addition on 4 bits. The four output bits of the adder 602 feed four respective inputs of the binary addition modules of the additional adder 700, which also receive either 0s or outputs from the additional storage register 702 as a function of the desired reduction in dynamics.

For example, to obtain the output register Out on 2 bits Out<0>, Out<1>, the additional storage register 702 comprises four synchronous flip-flops clocked by the clock frequency $F_H$, among which:
the first two synchronous flip-flops relating to the two least significant bits receive the respective outputs of the two binary addition modules of these two bits in order to supply them again with these input values at the next clock pulse, and
both of the following synchronous flip-flops relating to the two most significant bits receive the respective outputs of the two binary addition modules of these two bits for outputting values for the register Out.

The two binary addition modules relating to the two most significant bits receive 0s.

The bit Out<1> is determined by the output of the fourth synchronous flip-flop of the additional storage register 702.

Finally, the bit Out<0> is determined by the output of the third synchronous flip-flop of the additional storage register 702.

Thus, an always stable quantizer on 2 bits with order 1 Delta-Sigma modulation is obtained. The two most significant bits which have been truncated represent the rounded output and are replaced by zeros on the corresponding inputs of the additional adder 700. For these bits, the addition thus only consists in adding and propagating the carry of the least significant bit. In this way the result is the sum of the current accumulated phase value over 4 bits and the fraction over 2 bits subtracted from the previous result delayed by a clock period. It is indeed the full amount of the quantization error, which is the principle of a Delta-Sigma modulation. When using such an architecture to implement the Sigma-Delta modulation quantizers 302 and 304, it is advantageous to use the architecture of FIG. 14 to implement the loop filter 118.

Figure 20:
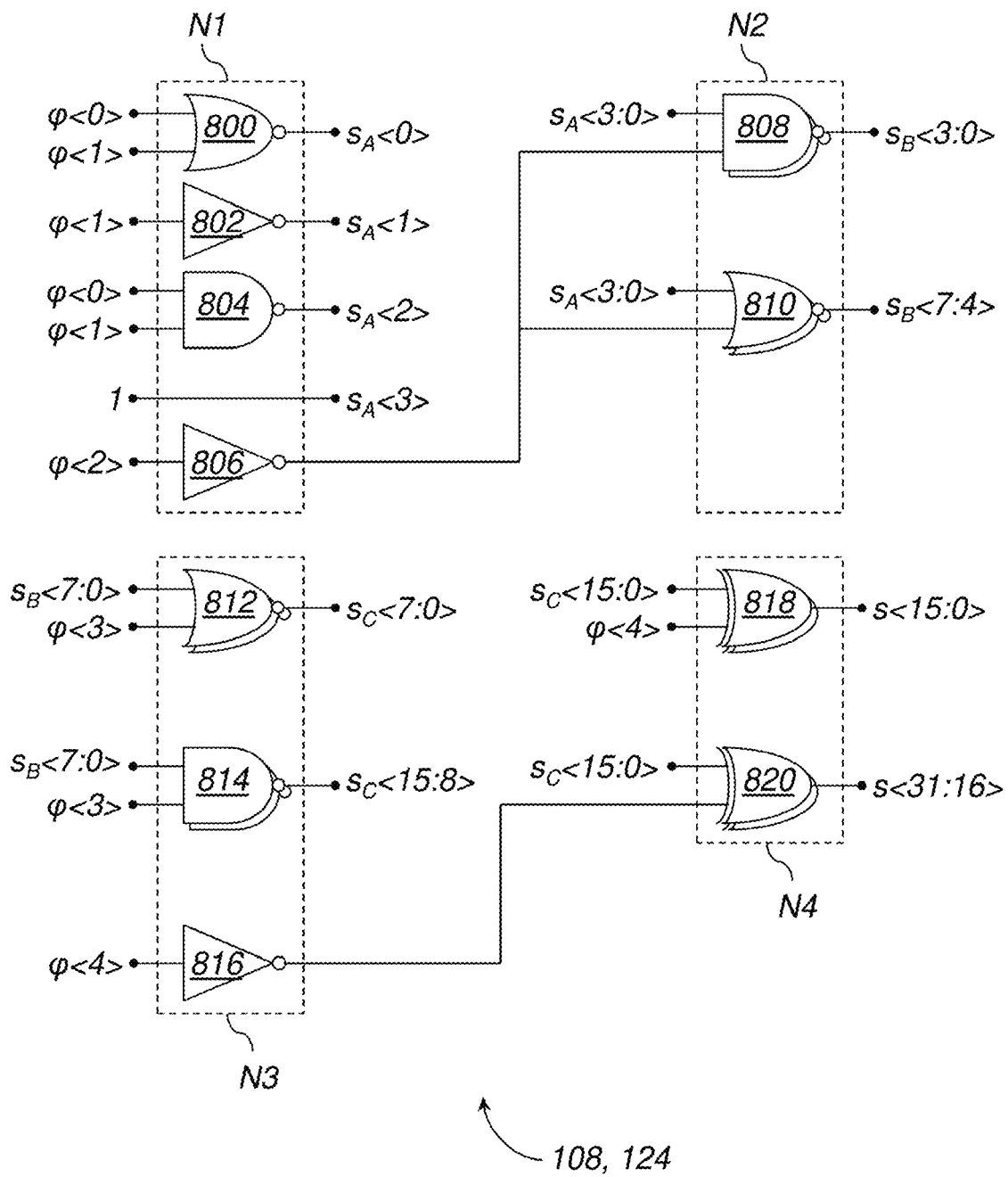

FIG. 20 schematically represents the general architecture, in terms of logic gates, of an example of multi-phase converter 108 or 124 adapted for the frequency synthesis device of FIG. 1, 8 or 9. This example is in particular adapted to the specific case according to which the phase accumulation values are coded on n or n'=5 bits for a number $T=2^5=32$ of logic signals at the output of the converter, according to the following correspondence matrix:

TABLE 2

| φ | s <31:0> |
|---|---|
| 0 | 11111111111111110000000000000000 |
| 1 | 11111111111111100000000000000001 |
| 2 | 11111111111111000000000000000011 |
| 3 | 11111111111110000000000000000111 |
| 4 | 11111111111100000000000000001111 |
| 5 | 11111111111000000000000000011111 |
| 6 | 11111111110000000000000000111111 |
| 7 | 11111111100000000000000001111111 |
| 8 | 11111111000000000000000011111111 |
| 9 | 11111110000000000000000111111111 |
| 10 | 11111100000000000000001111111111 |
| 11 | 11111000000000000000011111111111 |
| 12 | 11110000000000000000111111111111 |
| 13 | 11100000000000000001111111111111 |
| 14 | 11000000000000000011111111111111 |
| 15 | 10000000000000000111111111111111 |
| 16 | 00000000000000001111111111111111 |
| 17 | 00000000000000011111111111111110 |
| 18 | 00000000000000111111111111111100 |
| 19 | 00000000000001111111111111111000 |

TABLE 2-continued

| φ | s <31:0> |
|---|---|
| 20 | 00000000000011111111111111110000 |
| 21 | 00000000000111111111111111100000 |
| 22 | 00000000001111111111111111000000 |
| 23 | 00000000011111111111111110000000 |
| 24 | 00000000111111111111111100000000 |
| 25 | 00000001111111111111111000000000 |
| 26 | 00000011111111111111110000000000 |
| 27 | 00000111111111111111100000000000 |
| 28 | 00001111111111111111000000000000 |
| 29 | 00011111111111111110000000000000 |
| 30 | 00111111111111111100000000000000 |
| 31 | 01111111111111111000000000000000 |

Let us note φ<4:0> one of the T=32 possible phase accumulation values binary coded on ln(T)/ln(2)=5 bits φ<0> to φ<4> and s<31:0> the 32 resulting logic signals.

At a first level N1 of the multi-phase converter 108 or 124, a NOR logic gate 800 receives the bits φ<0> and φ<1> to supply a logic value of an intermediate logic signal $s_A$<0>. A NON logic gate 802 receives the bit φ<1> to supply a logic value of an intermediate logic signal $s_A$<1>. A NAND logic gate 804 receives the bits φ<0> and φ<1> to supply a logic value of an intermediate logic signal $s_A$<2>. A logic value of an intermediate logic signal $s_A$<3> is set to "1". A NON logic gate 806 receives the bit φ<2>.

At a second level N2 of the multi-phase converter 108 or 124, four NAND logic gates 808 respectively receive the four logic values of the four intermediate logic signals $s_A$<3:0> and the output of the NO gate logic 806 to respectively supply four logic values of four intermediate logic signals $s_B$<3:0>. Four NOR logic gates 810 respectively receive the four logic values of the four intermediate logic signals $s_A$<3:0> and the output of the NO logic gate 806 to respectively supply four logic values of four intermediate logic signals $5_B$<7:4>.

At a third level N3 of the multi-phase converter 108 or 124, eight NOR logic gates 812 respectively receive the eight logic values of the eight intermediate logic signals $s_B$<7:0> and the bit φ<3> to respectively supply eight logic values of eight intermediate logic signals $s_C$<7:0>. Eight NAND logic gates 814 respectively receive the eight logic values of the eight intermediate logic signals $s_B$<7:0> and the bit φ<3> to respectively supply eight logic values of eight intermediate logic signals $s_C$<15:8>. A NON logic gate 816 receives the bit φ<4>.

Finally, at a fourth level N4 of the multi-phase converter 108 or 124, sixteen XOR logic gates 818 receive respectively the sixteen logic values of the sixteen intermediate logic signals $s_C$<15:0> and the bit φ<4> to respectively supply the sixteen logic values of sixteen logic signals s<15:0>. Sixteen other XOR logic gates 820 receive respectively the sixteen logic values of the sixteen intermediate logic signals $s_C$<15:0> and the output of the NO logic gate 816 to supply respectively the sixteen logic values of the sixteen logic signals s<31:16>.

With regard to the general architectures of the frequency-controlled oscillator 120 and the frequency divider 202, these are well known and will not be detailed. The oscillator 120 is for example a voltage-controlled oscillator formed of an inductor placed in parallel with two varactors arranged head to tail and two NMOS transistors whose gates are mounted head to tail so as to generate a sufficient gain to initiate and then maintain the oscillation across the inductor, these transistors being polarized by the current from the power supply of the midpoint of the inductor.

Note also that the invention is not limited to the embodiments described above. It will appear to those skilled in the art that various modifications can be made to the embodiments described above, in the light of the teaching which has just been disclosed to them. In the detailed presentation of the invention which has been made previously, the terms used should not be interpreted as limiting the invention to the embodiments set out in this description, but must be interpreted to include all the equivalents the prediction of which is within the reach of those skilled person by applying their general knowledge to the implementation of the teaching which has just been disclosed to them.

The invention claimed is:

1. A feedback-loop frequency synthesis device comprising:
    an input intended to receive an electrical signal oscillating at a reference frequency;
    an output intended to supply an electrical signal oscillating at an output frequency;
    a servo circuit for the control of the output frequency by the reference frequency, connecting the input to the output of the device and comprising a first phase accumulator clocked at a frequency linked to the reference frequency, a phase comparison block, a loop filter and a frequency controlled oscillator providing the electrical signal oscillating at the output frequency, the phase comparison block being linked to the loop filter for controlling said frequency controlled oscillator; and
    a feedback loop connecting the output to the phase comparison block, comprising a second phase accumulator clocked at a frequency linked to the output frequency, the first and second phase accumulators being adapted to provide the same number T of possible phase accumulation discrete values;
    wherein the servo circuit is configured to provide, to the phase comparison block T first distinct logic signals the logic levels of which depend continuously on the phase accumulation values supplied by the first phase accumulator according to a first multi-phase correspondence matrix between the T possible phase accumulation discrete values and the T first signals;
    wherein the feedback loop is configured to provide, to the phase comparison block, T second distinct logic signals the logic levels of which depend continuously on the phase accumulation values supplied by second phase accumulator according to a second multi-phase correspondence matrix between the T possible phase accumulation discrete values and the T second signals; and
    wherein the phase comparison block comprises T phase comparators with logic gates receiving respectively in continuous time the T first logic signals on T first comparison inputs and the T second logic signals on T second comparison inputs.

2. The frequency synthesis device according to claim 1, wherein:
    the servo circuit comprises a first multi-phase converter between the first phase accumulator and the phase comparison block, configured to implement the first multi-phase correspondence matrix; and
    the feedback loop comprises a second multi-phase converter between the second phase accumulator and the phase comparison block, configured to implement the second multi-phase correspondence matrix.

3. The frequency synthesis device according to claim 2, wherein each of the first and second multi-phase converters implements its multi-phase correspondence matrix in the form a set of logic gates receiving as input a current value of phase accumulation binary coded on $\ln(T)/\ln(2)$ bits, where $\ln(.)$ is the natural logarithm function, and providing at output T current values of logic levels.

4. The frequency synthesis device according to claim 1, wherein each coefficient of each of the first and second multi-phase correspondence matrices is either at a first binary value indicative of a first logic level of logic signal, or at a second binary value indicative of a second logic level of logic signal.

5. The frequency synthesis device according to claim 4, wherein each row or column of each of the first and second multi-phase correspondence matrices, when this row or column indicates the logic levels that must be taken by one of the T first or second logic signals for the T possible phase accumulation discrete values, circularly presents by modulo T only a single transition from the first binary value to the second binary value for a first half of the T possible phase accumulation discrete values and only a single transition from the second binary value to the first binary value for a second half of the T possible phase accumulation discrete values.

6. The frequency synthesis device according to claim 4, wherein each row or column of each of the first and second multi-phase correspondence matrices, when this row or column indicates the logic levels that must be taken by one of the first T or second logic signals for the T possible phase accumulation discrete values, differs from that which precedes or from that which follows only by a shift of a column or respectively a line modulo T of the coefficient values it contains, this shift remaining in the same direction from the first to the last row or column.

7. The frequency synthesis device according to claim 1, wherein each of the first and second correspondence matrices is symmetrical.

8. The frequency synthesis device according to claim 1, wherein the first and second correspondence matrices are identical.

9. The frequency synthesis device according to claim 1, wherein the phase comparison block comprises T charge pumps receiving respectively in continuous time T pairs of pulse signals supplied by the T phase comparators and supplying T output currents in continuous time respectively.

10. The frequency synthesis device according to claim 9, wherein the phase comparison block comprises a current summator receiving in parallel the T output currents supplied by the T charge pumps for supplying a single summed current at the output of the phase comparison block.

\* \* \* \* \*